US012733239B2

(12) United States Patent
Sun et al.

(10) Patent No.: US 12,733,239 B2
(45) Date of Patent: Sep. 8, 2026

(54) UNDER EPITAXY ISOLATION STRUCTURE

(71) Applicant: Taiwan Semiconductor Manufacturing Co., Ltd., Hsinchu (TW)

(72) Inventors: Chih-Hung Sun, Hsinchu (TW); Wen-Kai Lin, Yilan (TW); Che-Hao Chang, Hsinchu (TW); Zhen-Cheng Wu, Hsinchu (TW); Chi On Chui, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 785 days.

(21) Appl. No.: 17/871,403

(22) Filed: Jul. 22, 2022

(65) Prior Publication Data

US 2023/0369428 A1 Nov. 16, 2023

Related U.S. Application Data

(60) Provisional application No. 63/364,499, filed on May 11, 2022.

(51) Int. Cl.

| | |
|---|---|
| ***H10D 30/67*** | (2025.01) |
| ***H10D 62/10*** | (2025.01) |
| ***H10D 64/01*** | (2025.01) |
| ***H10D 64/23*** | (2025.01) |

(52) U.S. Cl.

CPC ....... *H10D 64/258* (2025.01); *H10D 30/6735* (2025.01); *H10D 30/6757* (2025.01); *H10D 62/121* (2025.01); *H10D 64/017* (2025.01)

(58) Field of Classification Search

CPC ............ H10D 64/258; H10D 30/6735; H10D 30/6757; H10D 30/501–509; H10D 30/674; H10D 62/121; H10D 64/017; H10D 30/0273; H10D 30/6704; H10D 62/021; H10D 30/6758; H10D 30/6706; H10D 30/671; H10D 30/6713

See application file for complete search history.

(56) References Cited

U.S. PATENT DOCUMENTS

| | | | |
|---|---|---|---|
| 9,209,247 | B2 | 12/2015 | Colinge et al. |
| 9,236,267 | B2 | 1/2016 | De et al. |
| 9,412,817 | B2 | 8/2016 | Yang et al. |
| 9,412,828 | B2 | 8/2016 | Ching et al. |
| 9,472,618 | B2 | 10/2016 | Oxland |
| 9,502,265 | B1 | 11/2016 | Jiang et al. |

(Continued)

FOREIGN PATENT DOCUMENTS

| | | | |
|---|---|---|---|
| CN | 113054018 | A | 6/2021 |
| CN | 113517280 | A | 10/2021 |

(Continued)

*Primary Examiner* — Matthew C Landau
*Assistant Examiner* — David W Ward
(74) *Attorney, Agent, or Firm* — Slater Matsil, LLP

(57) ABSTRACT

Embodiments provide a two-tiered trench isolation structure under the epitaxial regions (e.g., epitaxial source/drain regions) of a nano-FET transistor device, and methods of forming the same. The first tier provides an isolation structure with a low k value. The second tier provides an isolation structure with a higher k value, with material greater density, and greater etch resistivity than the first tier isolation structure.

20 Claims, 42 Drawing Sheets

(56) References Cited

U.S. PATENT DOCUMENTS

| | | | | |
|---|---|---|---|---|
| 9,520,482 | B1 | 12/2016 | Chang et al. | |
| 9,536,738 | B2 | 1/2017 | Huang et al. | |
| 9,576,814 | B2 | 2/2017 | Wu et al. | |
| 9,608,116 | B2 | 3/2017 | Ching et al. | |
| 10,431,651 | B1 | 10/2019 | Chao et al. | |
| 2005/0087833 | A1 | 4/2005 | Schuegraf et al. | |
| 2012/0223407 | A1 | 9/2012 | Scheiper et al. | |
| 2015/0105234 | A1* | 4/2015 | Mcelwee-White | C07F 11/005 501/87 |
| 2016/0240652 | A1 | 8/2016 | Ching et al. | |
| 2017/0271477 | A1* | 9/2017 | Palle | H10D 64/017 |
| 2018/0301564 | A1* | 10/2018 | Kwon | H10D 64/017 |
| 2019/0341316 | A1* | 11/2019 | Reznicek | H10D 84/853 |
| 2020/0006476 | A1* | 1/2020 | Chao | H10D 30/43 |
| 2020/0006559 | A1 | 1/2020 | Mehandru et al. | |
| 2020/0105934 | A1 | 4/2020 | Ma et al. | |
| 2021/0226033 | A1 | 7/2021 | Huang et al. | |
| 2021/0257499 | A1* | 8/2021 | Shin | H01L 21/02532 |
| 2021/0320172 | A1* | 10/2021 | Yu | H10D 84/038 |
| 2021/0336006 | A1 | 10/2021 | Chen et al. | |
| 2021/0343713 | A1* | 11/2021 | Ju | H01L 21/28123 |
| 2021/0408230 | A1* | 12/2021 | More | H10D 84/0151 |
| 2022/0037498 | A1 | 2/2022 | Lin et al. | |
| 2022/0059703 | A1 | 2/2022 | More | |
| 2022/0069135 | A1 | 3/2022 | Chu et al. | |
| 2022/0093770 | A1 | 3/2022 | Lee et al. | |

FOREIGN PATENT DOCUMENTS

| | | | |
|---|---|---|---|
| KR | 20120099598 | A | 9/2012 |
| KR | 20180115392 | A | 10/2018 |
| KR | 20210071893 | A | 6/2021 |
| KR | 20210093709 | A | 7/2021 |
| KR | 20210133119 | A | 11/2021 |
| KR | 20220015968 | A | 2/2022 |
| KR | 20220029359 | A | 3/2022 |
| KR | 20220039539 | A | 3/2022 |
| TW | 202203369 | A | 1/2022 |

* cited by examiner

UNDER EPITAXY ISOLATION STRUCTURE

PRIORITY CLAIM AND CROSS-REFERENCE

This application claims the benefit of U.S. Provisional Application No. 63/364,499, filed on May 11, 2022, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
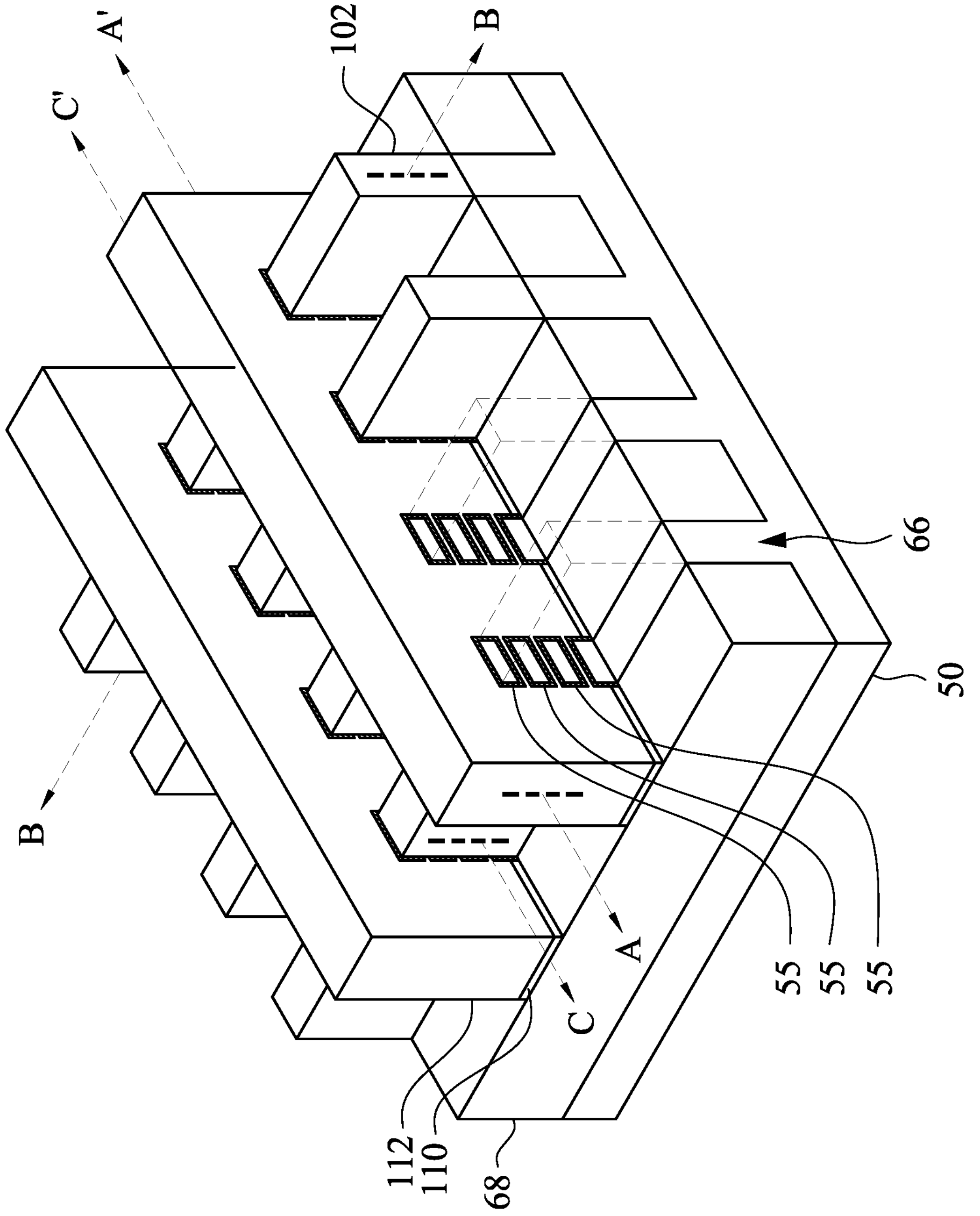
FIG. 1 illustrates an example of a nanostructure field-effect transistor (nano-FET) in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments are described below in a particular context, a die comprising nano-FETs. Various embodiments may be applied, however, to dies comprising other types of transistors (e.g., fin field effect transistors (FinFETs)) in lieu of or in combination with the nano-FETs.

Nano-FET transistors include multiple gate-all-around channel regions vertically stacked and interposed between opposing source/drain regions. The source/drain regions are formed within a semiconductor fin by removing a portion of the fin to form a recess and growing an epitaxial material in the recess. Current leakage can occur, however, at the bottom of the recess after the source/drain has been formed. For example, the source/drain region may be in contact with the semiconductor material of the semiconductor fin and current can leak through the contact points. In addition, capacitance can be observed between the source/drain region and adjacent source/drain regions through the semiconductor material. Embodiments seek to reduce or eliminate current leakage and capacitance issues by forming a low-k insulation material at the bottom of the recesses prior to forming the source/drain regions. In addition, an upper isolation layer is provided over the low-k insulation material to protect the low- k insulation material. Together, the low-k insulation material and the upper isolation layer form a trench isolation structure.

FIG. 1 illustrates an example of nano-FETs (e.g., nanowire FETs, nanosheet FETs (Nano-FETs), or the like) in a three-dimensional view, in accordance with some embodiments. The nano-FETs comprise nanostructures 55 (e.g., nanosheets, nanowire, or the like) over fins 66 on a substrate 50 (e.g., a semiconductor substrate), wherein the nanostructures 55 act as channel regions for the nano-FETs. The nanostructure 55 may include p-type nanostructures, n-type nanostructures, or a combination thereof. Isolation regions 68 are disposed between adjacent fins 66, which may protrude above and from between neighboring isolation regions 68. Although the isolation regions 68 are described/illustrated as being separate from the substrate 50, as used herein, the term "substrate" may refer to the semiconductor substrate alone or a combination of the semiconductor substrate and the isolation regions. Additionally, although a bottom portion of the fins 66 are illustrated as being single, continuous materials with the substrate 50, the bottom portion of the fins 66 and/or the substrate 50 may comprise a single material or a plurality of materials. In this context, the fins 66 refer to the portion extending between the neighboring isolation regions 68.

Gate dielectric layers 110 are over top surfaces of the fins 66 and along top surfaces, sidewalls, and bottom surfaces of the nanostructures 55. Gate electrodes 112 are over the gate dielectric layers 110. Epitaxial source/drain regions 102 are disposed on the fins 66 on opposing sides of the gate dielectric layers 110 and the gate electrodes 112. Source/ drain region(s) 102 may refer to a source or a drain, individually or collectively dependent upon the context.

FIG. 1 further illustrates reference cross-sections that are used in later figures. Cross-section A-A' is along a longitudinal axis of a gate electrode 112 and in a direction, for example, perpendicular to the direction of current flow between the epitaxial source/drain regions 102 of a nano-FET. Cross-section B-B' is perpendicular to cross-section A-A' and is parallel to a longitudinal axis of a fin 66 of the nano-FET and in a direction of, for example, a current flow between the epitaxial source/drain regions 102 of the nano-FET. Cross-section C-C' is parallel to cross-section A-A' and extends through epitaxial source/drain regions of the nano-FETs. Subsequent figures refer to these reference cross-sections for clarity.

Some embodiments discussed herein are discussed in the context of nano-FETs formed using a gate-last process. In other embodiments, a gate-first process may be used. Also, some embodiments contemplate aspects used in planar devices, such as planar FETs or in fin field-effect transistors (FinFETs).

FIGS. 2 through 24C are cross-sectional views of intermediate stages in the manufacturing of nano-FETs, in accordance with some embodiments. FIGS. 2 through 5, 6A, 17A, 18A, 19A, 20A, 21A, 22A, 23A, and 24A illustrate reference cross-section A-A' illustrated in FIG. 1. FIGS. 6B, 7B, 8B, 9B, 10B, 11B, 11C, 12B, 13B, 14B, 15B, 15C, 15D, 16B, 16D, 17B, 18B, 19B, 20B, 21B, 22B, 23B, and 24B illustrate reference cross-section B-B' illustrated in FIG. 1. FIGS. 7A, 8A, 9A, 10A, 11A, 12A, 13A, 14A, 15A, 16A, 16C, 17C, 22C, 23C, and 24C illustrate reference cross-section C-C' illustrated in FIG. 1.

Figure 2:
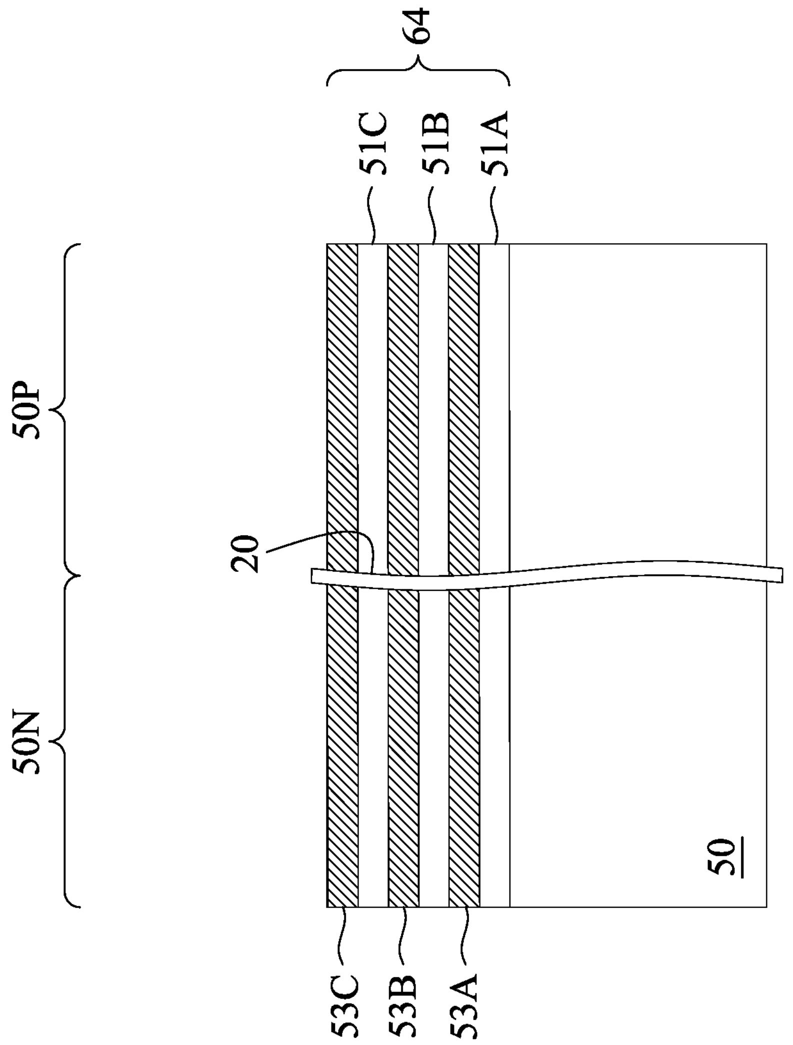
FIGS. 2, 3, 4, 5, 6A, 6B, 7A, 7B 8A, 8B, 9A, 9B, 10A, 10B, 11A, 11B, 11C, 12A, 12B, 13A, 13B, 14A, 14B, 15A, 15B, 15C, 15D, 16A, 16B, 16C, 16D, 17A, 17B, 17C, 18A, 18B, 19A, 19B, 20A, 20B, 21A, 21B, 22A, 22B, 22C, 23A, 23B, and 23C are cross-sectional views of intermediate stages in the manufacturing of nano-FETs, in accordance with some embodiments.

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has an n-type region 50N and a p-type region 50P. The n-type region 50N can be for forming n-type devices, such as NMOS transistors, e.g., n-type nano-FETs, and the p-type region 50P can be for forming p-type devices, such as PMOS transistors, e.g., p-type nano-FETs. The n-type region 50N may be physically separated from the p-type region 50P (as illustrated by divider 20), and any number of device features (e.g., other active devices, doped regions, isolation structures, etc.) may be disposed between the n-type region 50N and the p-type region 50P. Although one n-type region 50N and one p-type region 50P are illustrated, any number of n-type regions 50N and p-type regions 50P may be provided.

Further in FIG. 2, a multi-layer stack 64 is formed over the substrate 50. The multi-layer stack 64 includes alternating layers of first semiconductor layers 51A-C (collectively referred to as first semiconductor layers 51) and second semiconductor layers 53A-C (collectively referred to as second semiconductor layers 53). For purposes of illustration and as discussed in greater detail below, the second semiconductor layers 53 will be removed and the first semiconductor layers 51 will be patterned to form channel regions of nano-FETs in the p- type region 50P. Also, the first semiconductor layers 51 will be removed and the second semiconductor layers 53 will be patterned to form channel regions of nano-FETs in the n-type region 50N. Nevertheless, in some embodiments the first semiconductor layers 51 may be removed and the second semiconductor layers 53 may be patterned to form channel regions of nano-FETs in the p-type region 50P, and the second semiconductor layers 53 may be removed and the first semiconductor layers 51 may be patterned to form channel regions of nano-FETs in the n-type region 50N.

Figure 24A:
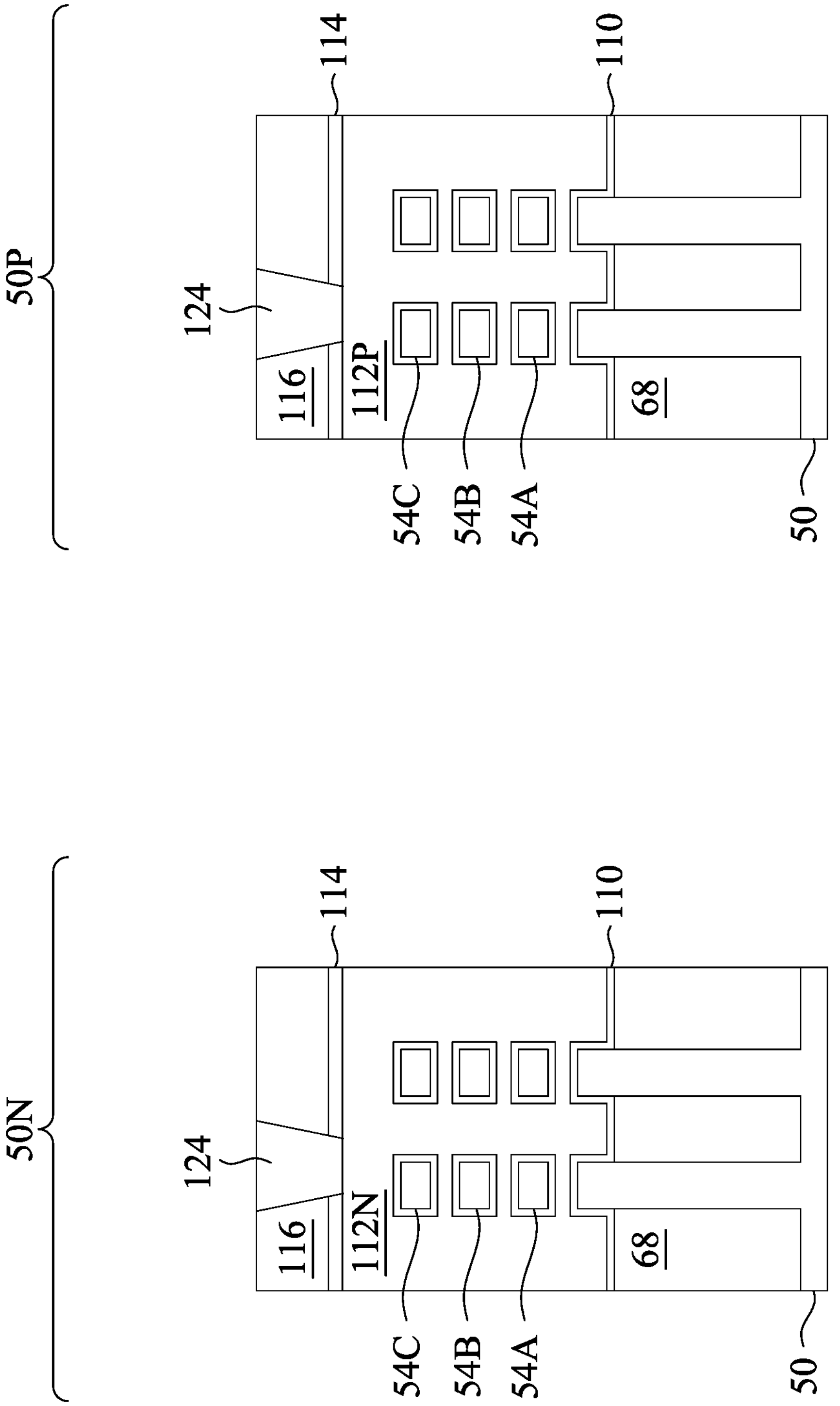
FIGS. 24A, 24B, and 24C are cross-sectional views of a nano-FET, in accordance with some embodiments.
Figure 24B:
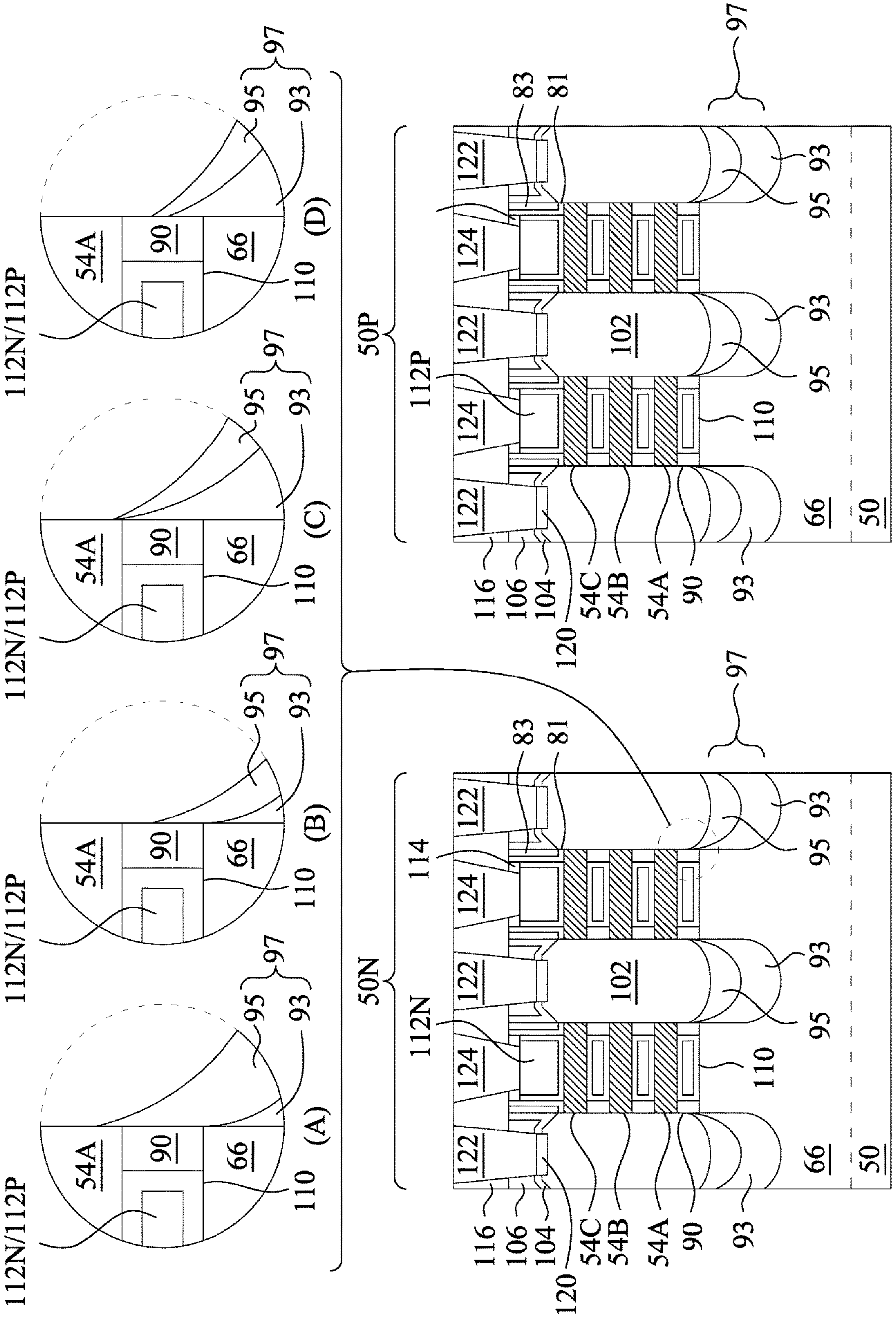
Figure 24C:
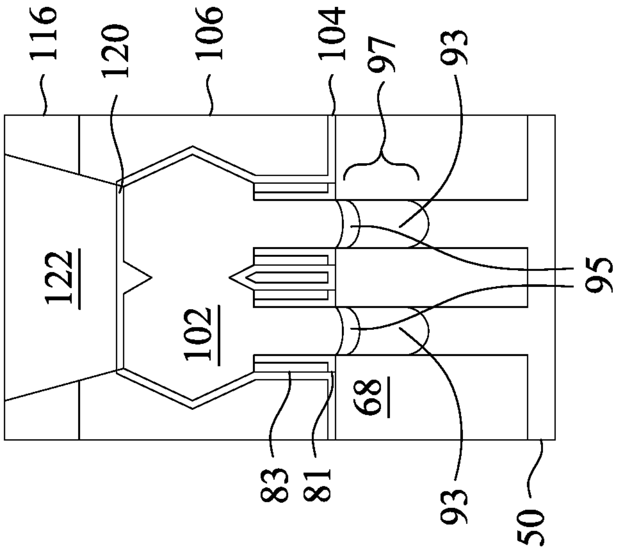

In still other embodiments, the first semiconductor layers 51 may be removed and the second semiconductor layers 53 may be patterned to form channel regions of nano-FETS in both the n-type region 50N and the p-type region 50P. In other embodiments, the second semiconductor layers 53 may be removed and the first semiconductor layers 51 may be patterned to form channel regions of nano-FETs in both the n-type region 50N and the p-type region 50P. In such embodiments, the channel regions in both the n-type region 50N and the p-type region 50P may have a same material composition (e.g., silicon, or another semiconductor material) and be formed simultaneously. FIGS. 24A, 24B, and 24C illustrate a structure resulting from such embodiments where the channel regions in both the p-type region 50P and the n-type region 50N comprise silicon, for example.

The multi-layer stack 64 is illustrated as including three layers of each of the first semiconductor layers 51 and the second semiconductor layers 53 for illustrative purposes. In some embodiments, the multi-layer stack 64 may include any number of the first semiconductor layers 51 and the second semiconductor layers 53. Each of the layers of the multi-layer stack 64 may be epitaxially grown using a process such as chemical vapor deposition (CVD), atomic layer deposition (ALD), vapor phase epitaxy (VPE), molecular beam epitaxy (MBE), or the like. In various embodiments, the first semiconductor layers 51 may be formed of a first semiconductor material suitable for p-type nano-FETs, such as silicon germanium, or the like, and the second semiconductor layers 53 may be formed of a second semiconductor material suitable for n-type nano-FETs, such as silicon, silicon carbon, or the like. The multi-layer stack 64 is illustrated as having a bottommost semiconductor layer suitable for p-type nano-FETs for illustrative purposes. In some embodiments, multi-layer stack 64 may be formed such that the bottommost layer is a semiconductor layer suitable for n-type nano-FETs.

The first semiconductor materials and the second semiconductor materials may be materials having a high-etch selectivity to one another. As such, the first semiconductor layers 51 of the first semiconductor material may be removed without significantly removing the second semiconductor layers 53 of the second semiconductor material in the n-type region 50N, thereby allowing the second semiconductor layers 53 to be patterned to form channel regions of n-type nano-FETs. Similarly, the second semiconductor layers 53 of the second semiconductor material may be removed without significantly removing the first semiconductor layers 51 of the first semiconductor material in the p-type region 50P, thereby allowing the first semiconductor layers 51 to be patterned to form channel regions of p-type nano-FETs.

Figure 3:
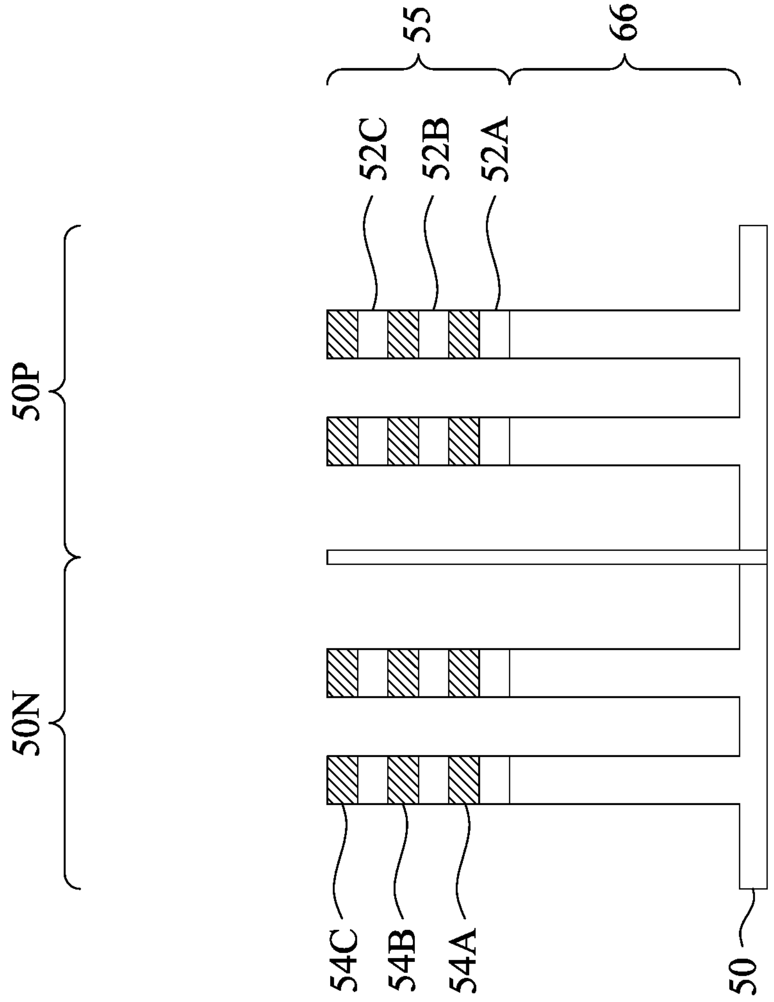

Referring now to FIG. 3, fins 66 are formed in the substrate 50 and nanostructures 55 are formed in the multi-layer stack 64, in accordance with some embodiments. In some embodiments, the nanostructures 55 and the fins 66 may be formed in the multi-layer stack 64 and the substrate 50, respectively, by etching trenches in the multi-layer stack 64 and the substrate 50. The etching may be any acceptable etch process, such as a reactive ion etch (RIE), neutral beam etch (NBE), the like, or a combination thereof. The etching may be anisotropic. Forming the nanostructures 55 by etching the multi-layer stack 64 may further define first nanostructures 52A-C (collectively referred to as the first nanostructures 52) from the first semiconductor layers 51 and define second nanostructures 54A-C (collectively referred to as the second nanostructures 54) from the second semiconductor layers 53. The first nanostructures 52 and the second nanostructures 54 may further be collectively referred to as nanostructures 55.

The fins 66 and the nanostructures 55 may be patterned by any suitable method. For example, the fins 66 and the nanostructures 55 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins 66.

FIG. 3 illustrates the fins 66 in the n-type region 50N and the p-type region 50P as having substantially equal widths for illustrative purposes. In some embodiments, widths of the fins 66 in the n-type region 50N may be greater or thinner than the fins 66 in the p-type region 50P. Further, while each of the fins 66 and the nanostructures 55 are illustrated as having a consistent width throughout, in other embodiments, the fins 66 and/or the nanostructures 55 may have tapered sidewalls such that a width of each of the fins 66 and/or the nanostructures 55 continuously increases in a direction towards the substrate 50. In such embodiments, each of the nanostructures 55 may have a different width and be trapezoidal in shape.

Figure 4:
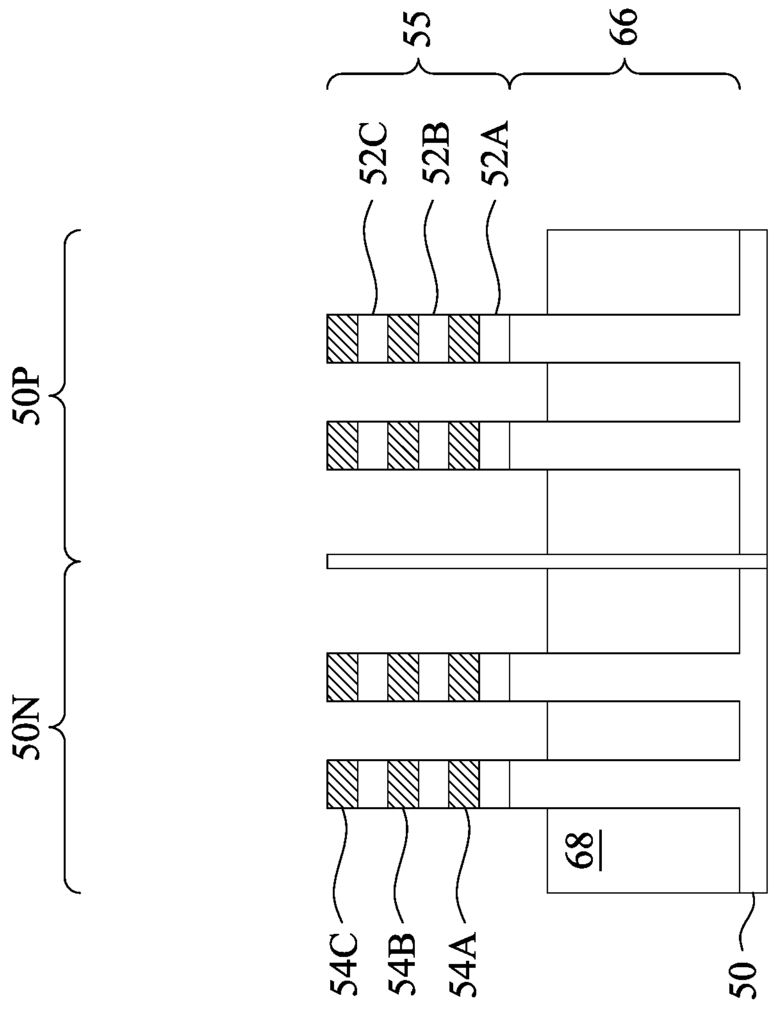

In FIG. 4, shallow trench isolation (STI) regions 68 are formed adjacent the fins 66. The STI regions 68 may be formed by depositing an insulation material over the substrate 50, the fins 66, and nanostructures 55, and between adjacent fins 66. The insulation material may be an oxide, such as silicon oxide, a nitride, the like, or a combination thereof, and may be formed by high-density plasma CVD (HDP-CVD), flowable CVD (FCVD), the like, or a combination thereof. Other insulation materials formed by any acceptable process may be used. In the illustrated embodiment, the insulation material is silicon oxide formed by an FCVD process. An anneal process may be performed once the insulation material is formed. In an embodiment, the insulation material is formed such that excess insulation material covers the nanostructures 55. Although the insulation material is illustrated as a single layer, some embodiments may utilize multiple layers. For example, in some embodiments a liner (not separately illustrated) may first be formed along a surface of the substrate 50, the fins 66, and the nanostructures 55. Thereafter, a fill material, such as those discussed above may be formed over the liner.

A removal process is then applied to the insulation material to remove excess insulation material over the nanostructures 55. In some embodiments, a planarization process such as a chemical mechanical polish (CMP), an etch-back process, combinations thereof, or the like may be utilized. The planarization process exposes the nanostructures 55 such that top surfaces of the nanostructures 55 and the insulation material are level after the planarization process is complete.

The insulation material is then recessed to form the STI regions 68. The insulation material is recessed such that upper portions of fins 66 in the n-type region 50N and the p-type region 50P protrude from between neighboring STI regions 68. Further, the top surfaces of the STI regions 68 may have a flat surface as illustrated, a convex surface, a concave surface (such as dishing), or a combination thereof. The top surfaces of the STI regions 68 may be formed flat, convex, and/or concave by an appropriate etch. The STI regions 68 may be recessed using an acceptable etching process, such as one that is selective to the material of the insulation material (e.g., etches the material of the insulation material at a faster rate than the material of the fins 66 and the nanostructures 55). For example, an oxide removal using, for example, dilute hydrofluoric (dHF) acid may be used.

The process described above with respect to FIGS. 2 through 4 is just one example of how the fins 66 and the nanostructures 55 may be formed. In some embodiments, the fins 66 and/or the nanostructures 55 may be formed using a mask and an epitaxial growth process. For example, a dielectric layer can be formed over a top surface of the substrate 50, and trenches can be etched through the dielectric layer to expose the underlying substrate 50. Epitaxial structures can be epitaxially grown in the trenches, and the dielectric layer can be recessed such that the epitaxial structures protrude from the dielectric layer to form the fins 66 and/or the nanostructures 55. The epitaxial structures may comprise the alternating semiconductor materials discussed above, such as the first semiconductor materials and the second semiconductor materials. In some embodiments where epitaxial structures are epitaxially grown, the epitaxially grown materials may be in situ doped during growth, which may obviate prior and/or subsequent implantations, although in situ and implantation doping may be used together.

Additionally, the first semiconductor layers 51 (and resulting nanostructures 52) and the second semiconductor layers 53 (and resulting nanostructures 54) are illustrated and discussed herein as comprising the same materials in the p-type region 50P and the n-type region 50N for illustrative purposes only. However, in some embodiments one or both of the first semiconductor layers 51 and the second semiconductor layers 53 may be different materials or formed in a different order in the p-type region 50P and the n-type region 50N.

Figure 8A:
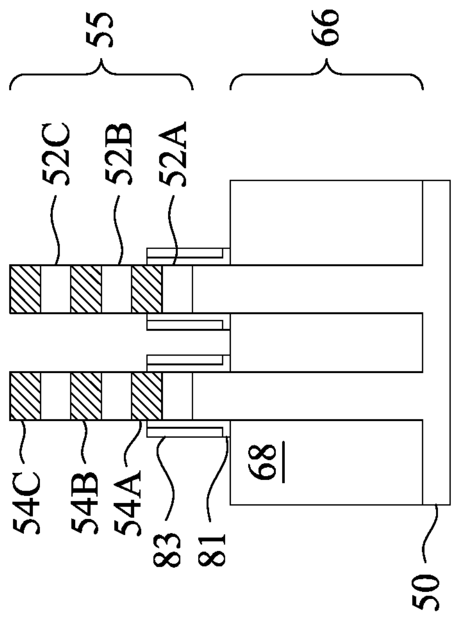
Figure 8B:
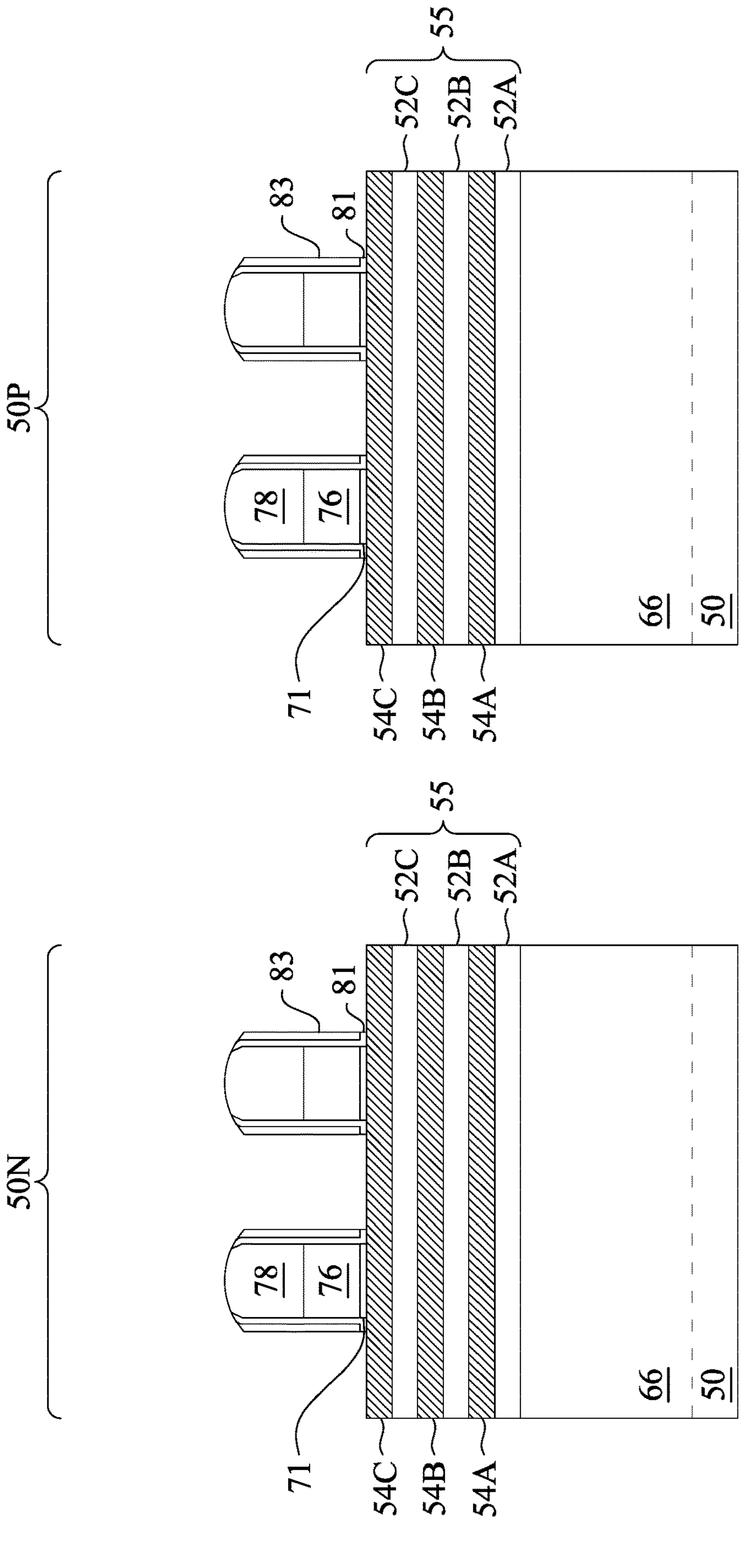

As illustrated in FIG. 8A, the first spacers 81 and the second spacers 83 are disposed on sidewalls of the fins 66 and/or nanostructures 55. As illustrated in FIG. 8B, in some embodiments, the second spacer layer 82 may be removed from over the first spacer layer 80 adjacent the masks 78, the dummy gates 76, and the dummy gate dielectrics 71, and the first spacers 81 are disposed on sidewalls of the masks 78, the dummy gates 76, and the the dummy gate dielectrics 71.

In other embodiments, a portion of the second spacer layer 82 may remain over the first spacer layer 80 adjacent the masks 78, the dummy gates 76, and the dummy gate dielectrics 71.

Further in FIG. 4, appropriate wells (not separately illustrated) may be formed in the fins 66, the nanostructures 55, and/or the STI regions 68. In embodiments with different well types, different implant steps for the n-type region 50N and the p-type region 50P may be achieved using a photoresist or other masks (not separately illustrated). For example, a photoresist may be formed over the fins 66 and the STI regions 68 in the n-type region 50N and the p-type region 50P. The photoresist is patterned to expose the p-type region 50P. The photoresist can be formed by using a spin-on technique and can be patterned using acceptable photolithography techniques. Once the photoresist is patterned, an n-type impurity implant is performed in the p-type region 50P, and the photoresist may act as a mask to substantially prevent n-type impurities from being implanted into the n-type region 50N. The n-type impurities may be phosphorus, arsenic, antimony, or the like implanted in the region to a concentration in a range from about $10^{13}$ atoms/$cm^3$ to about $10^{14}$ atoms/$cm^3$. After the implant, the photoresist is removed, such as by an acceptable ashing process.

Following or prior to the implanting of the p-type region 50P, a photoresist or other masks (not separately illustrated) is formed over the fins 66, the nanostructures 55, and the STI regions 68 in the p-type region 50P and the n-type region 50N. The photoresist is patterned to expose the n-type region 50N. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration in a range from about $10^{13}$ atoms/$cm^3$ to about $10^{14}$ atoms/$cm^3$. After the implant, the photoresist may be removed, such as by an acceptable ashing process.

After the implants of the n-type region 50N and the p-type region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 5:
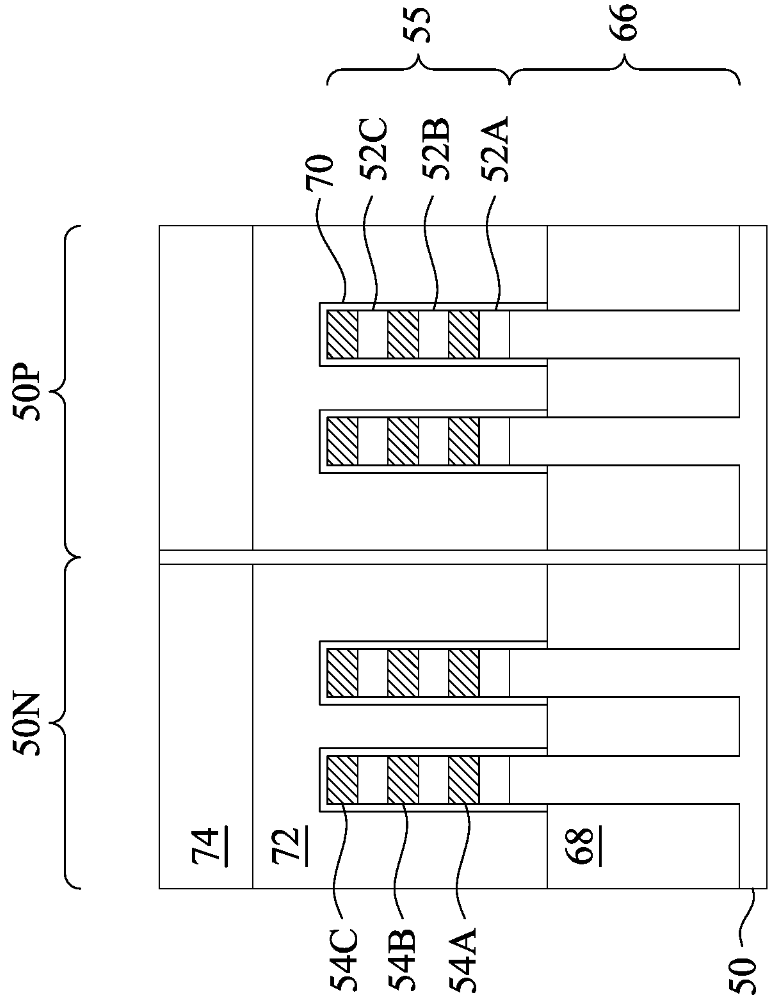

In FIG. 5, a dummy dielectric layer 70 is formed on the fins 66 and/or the nanostructures 55. The dummy dielectric layer 70 may be, for example, silicon oxide, silicon nitride, a combination thereof, or the like, and may be deposited or thermally grown according to acceptable techniques. A dummy gate layer 72 is formed over the dummy dielectric layer 70, and a mask layer 74 is formed over the dummy gate layer 72. The dummy gate layer 72 may be deposited over the dummy dielectric layer 70 and then planarized, such as by a CMP. The mask layer 74 may be deposited over the dummy gate layer 72. The dummy gate layer 72 may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 72 may be deposited by physical vapor deposition (PVD), CVD, sputter deposition, or other techniques for depositing the selected material. The dummy gate layer 72 may be made of other materials that have a high etching selectivity from the etching of isolation regions. The mask layer 74 may include, for example, silicon nitride, silicon oxynitride, or the like. In this example, a single dummy gate layer 72 and a single mask layer 74 are formed across the n-type region 50N and the p-type region 50P. It is noted that the dummy dielectric layer 70 is shown covering only the fins 66 and the nanostructures 55 for illustrative purposes only. In some embodiments, the dummy dielectric layer 70 may be deposited such that the dummy dielectric layer 70 covers the STI regions 68, such that the dummy dielectric layer 70 extends between the dummy gate layer 72 and the STI regions 68.

Figure 6A:
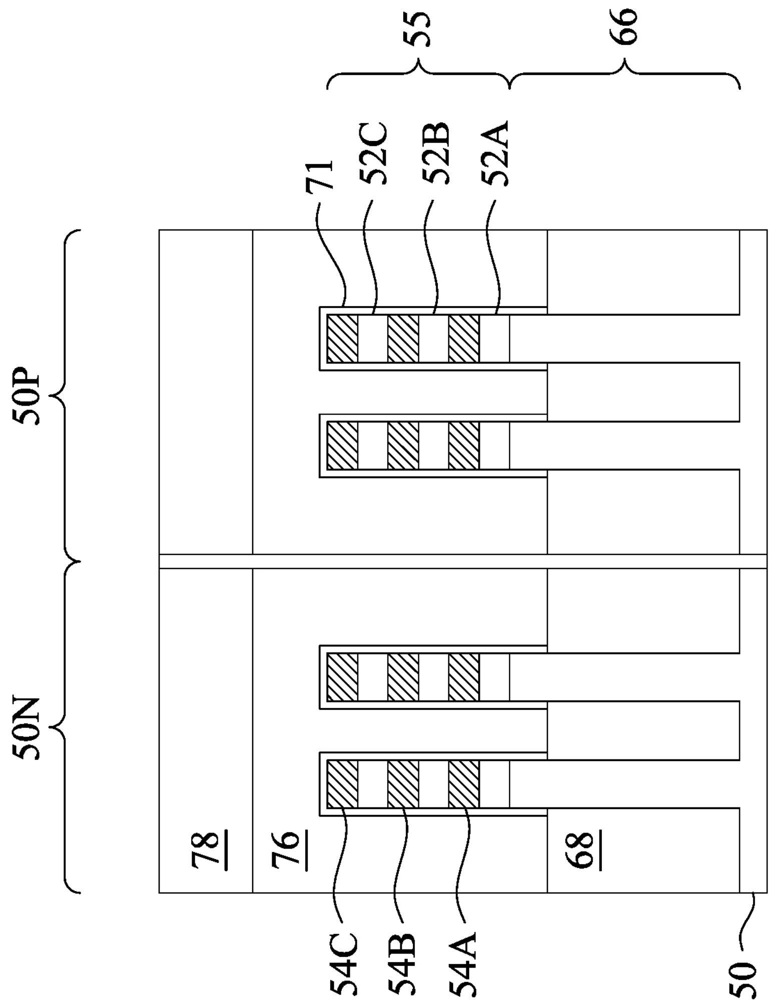
Figure 6B:
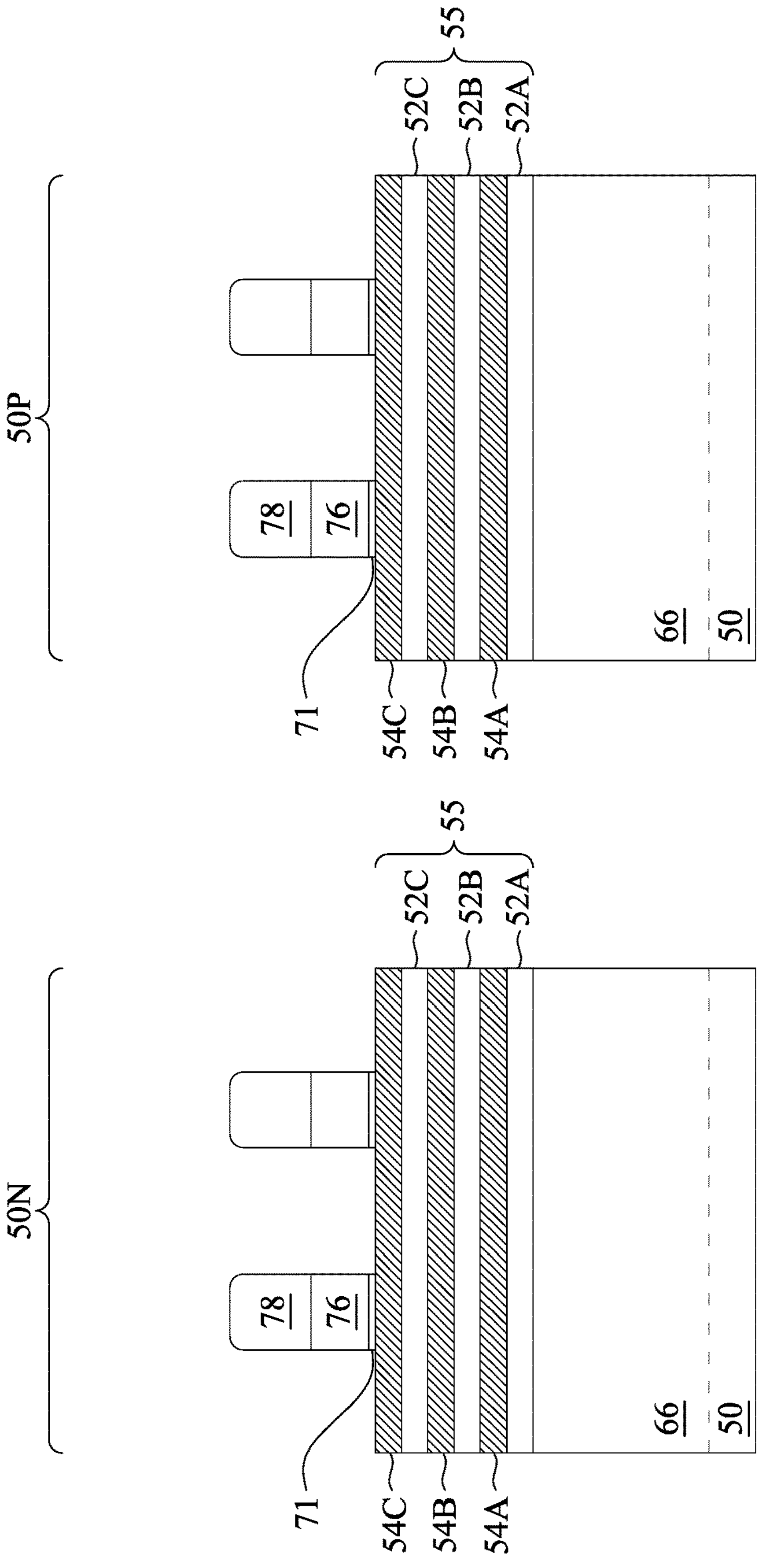

FIGS. 6A through 23C illustrate various additional steps in the manufacturing of embodiment devices. FIGS. 6A, 7A, 8A, 9A, 10A, 11A, 12A, 13A, 14A, 15A, 16A, 16C, 17A, 17C, 18A, 19A, 22C, and 23C illustrate features in either the regions 50N or the regions 50P. In FIGS. 6A and 6B, the mask layer 74 (see FIG. 5) may be patterned using acceptable photolithography and etching techniques to form masks 78. The pattern of the masks 78 then may be transferred to the dummy gate layer 72 and to the dummy dielectric layer 70 to form dummy gates 76 and dummy gate dielectrics 71, respectively. The dummy gates 76 cover respective channel regions of the fins 66. The pattern of the masks 78 may be used to physically separate each of the dummy gates 76 from adjacent dummy gates 76. The dummy gates 76 may also have a lengthwise direction substantially perpendicular to the lengthwise direction of respective fins 66.

Figure 7A:
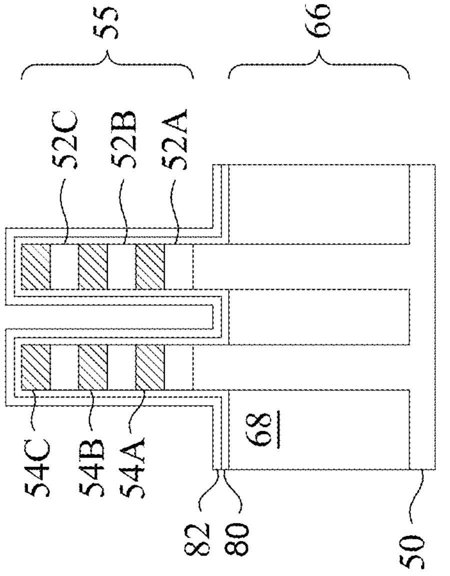
Figure 7B:
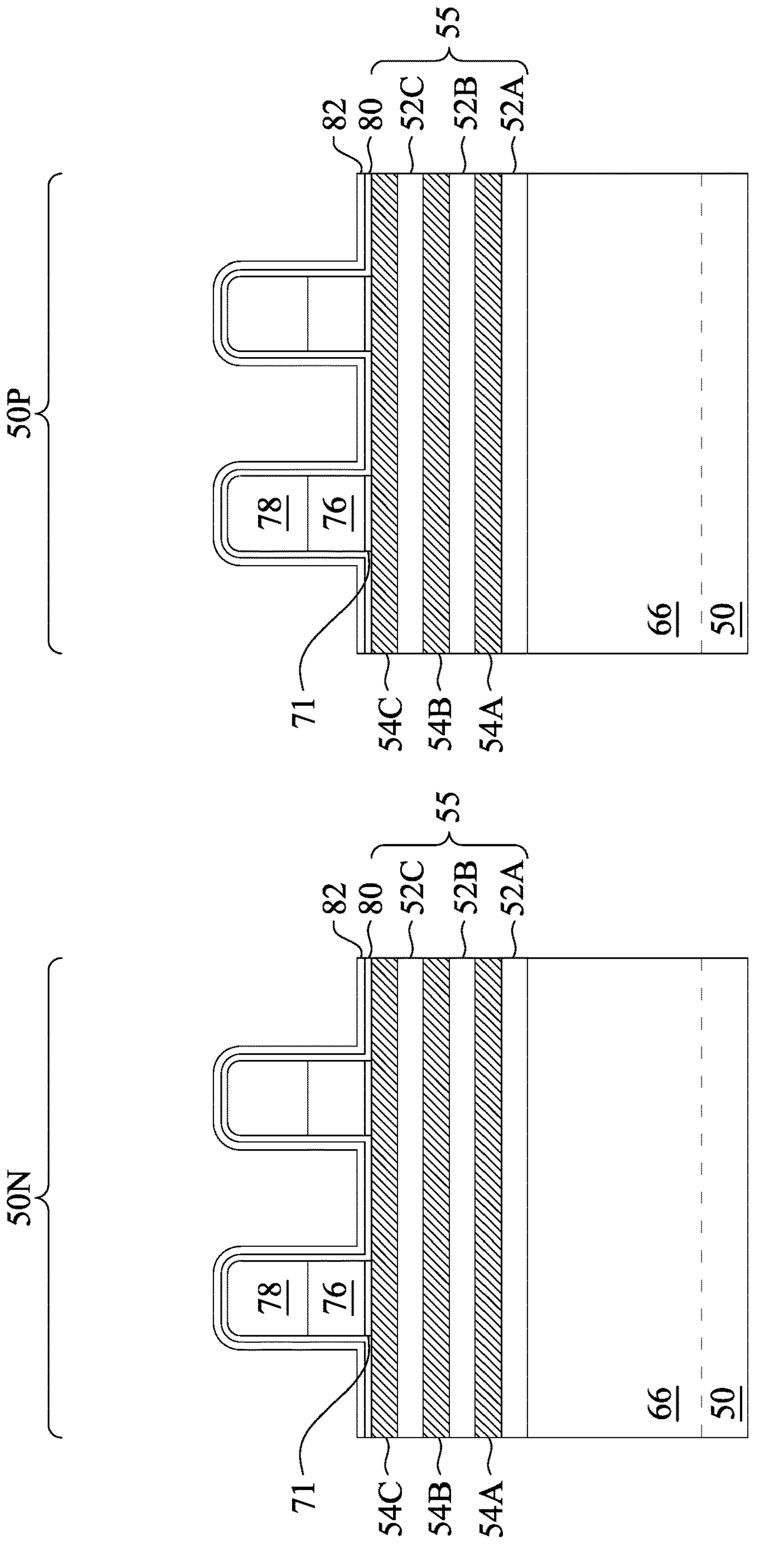

In FIGS. 7A and 7B, a first spacer layer 80 and a second spacer layer 82 are formed over the structures illustrated in FIGS. 6A and 6B, respectively. The first spacer layer 80 and the second spacer layer 82 will be subsequently patterned to act as spacers for forming self-aligned source/drain regions. In FIGS. 7A and 7B, the first spacer layer 80 is formed on top surfaces of the STI regions 68; top surfaces and sidewalls of the fins 66, the nanostructures 55, and the masks 78; and sidewalls of the dummy gates 76 and the dummy gate dielectric 71. The second spacer layer 82 is deposited over the first spacer layer 80. The first spacer layer 80 may be formed of silicon oxide, silicon nitride, silicon oxynitride, or the like, using techniques such as thermal oxidation or deposited by CVD, ALD, or the like. The second spacer layer 82 may be formed of a material having a different etch rate than the material of the first spacer layer 80, such as silicon oxide, silicon nitride, silicon oxynitride, or the like, and may be deposited by CVD, ALD, or the like.

After the first spacer layer 80 is formed and prior to forming the second spacer layer 82, implants for lightly doped source/drain (LDD) regions (not separately illustrated) may be performed. In embodiments with different device types, similar to the implants discussed above in FIG. 4, a mask, such as a photoresist, may be formed over the n-type region 50N, while exposing the p-type region 50P, and appropriate type (e.g., p-type) impurities may be implanted into the exposed fins 66 and nanostructures 55 in the p-type region 50P. The mask may then be removed. Subsequently, a mask, such as a photoresist, may be formed over the p-type region 50P while exposing the n-type region 50N, and appropriate type impurities (e.g., n-type) may be implanted into the exposed fins 66 and nanostructures 55 in the n-type region 50N. The mask may then be removed. The n-type impurities may be the any of the n-type impurities previously discussed, and the p-type impurities may be the any of the p-type impurities previously discussed. The lightly doped source/drain regions may have a concentration of impurities in a range from about $1\times10^{15}$ atoms/$cm^3$ to about $1\times10^{19}$ atoms/$cm^3$. An anneal may be used to repair implant damage and to activate the implanted impurities.

In FIGS. 8A and 8B, the first spacer layer 80 and the second spacer layer 82 are etched to form first spacers 81 and second spacers 83. As will be discussed in greater detail below, the first spacers 81 and the second spacers 83 act to self-aligned subsequently formed source drain regions, as well as to protect sidewalls of the fins 66 and/or nanostructure 55 during subsequent processing. The first spacer layer 80 and the second spacer layer 82 may be etched using a suitable etching process, such as an isotropic etching process (e.g., a wet etching process), an anisotropic etching process (e.g., a dry etching process), or the like. In some embodiments, the material of the second spacer layer 82 has a different etch rate than the material of the first spacer layer 80, such that the first spacer layer 80 may act as an etch stop layer when patterning the second spacer layer 82 and such that the second spacer layer 82 may act as a mask when patterning the first spacer layer 80. For example, the second spacer layer 82 may be etched using an anisotropic etch process wherein the first spacer layer 80 acts as an etch stop layer, wherein remaining portions of the second spacer layer 82 form second spacers 83 as illustrated in FIG. 8A. Thereafter, the second spacers 83 acts as a mask while etching exposed portions of the first spacer layer 80, thereby forming first spacers 81 as illustrated in FIG. 8A.

As illustrated in FIG. 8A, the first spacers 81 and the second spacers 83 are disposed on sidewalls of the fins 66 and/or nanostructures 55. As illustrated in FIG. 8B, in some embodiments, the second spacer layer 82 may be removed from over the first spacer layer 80 adjacent the masks 78, the dummy gates 76, and the dummy gate dielectrics 71, and the first spacers 81 are disposed on sidewalls of the masks 78, the dummy gates 76, and the dummy dielectric layers 60. In other embodiments, a portion of the second spacer layer 82 may remain over the first spacer layer 80 adjacent the masks 78, the dummy gates 76, and the dummy gate dielectrics 71.

It is noted that the above disclosure generally describes a process of forming spacers and LDD regions. Other processes and sequences may be used. For example, fewer or additional spacers may be utilized, different sequence of steps may be utilized (e.g., the first spacers 81 may be patterned prior to depositing the second spacer layer 82), additional spacers may be formed and removed, and/or the like. Furthermore, the n-type and p-type devices may be formed using different structures and steps.

Figure 9A:
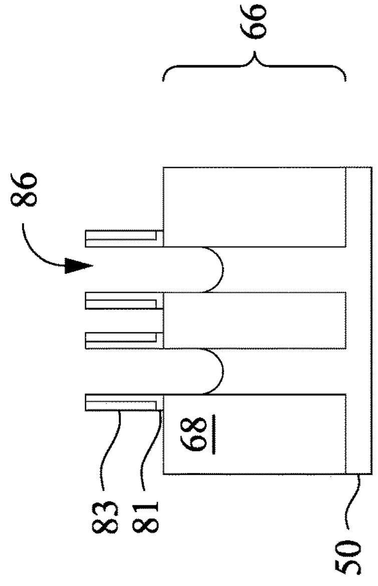
Figure 9B:
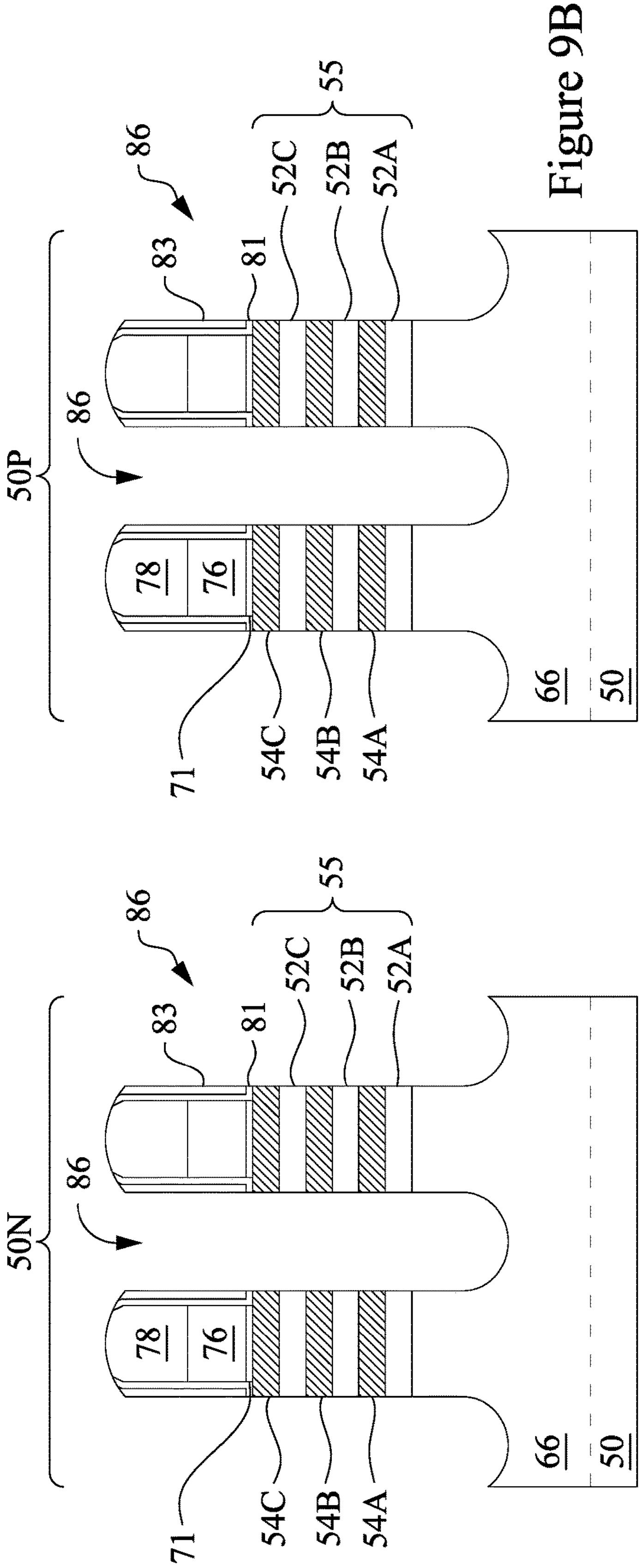

In FIGS. 9A and 9B, first recesses 86 are formed in the fins 66, the nanostructures 55, and the substrate 50, in accordance with some embodiments. Epitaxial source/drain regions will be subsequently formed in the first recesses 86. The first recesses 86 may extend through the first nanostructures 52 and the second nanostructures 54, and into the substrate 50. As illustrated in FIG. 9A, the fins 66 may be etched such that bottom surfaces of the first recesses 86 are disposed below the top surfaces of the STI regions 68. In various embodiments, top surfaces of the STI regions 68 may be level with bottom surfaces of the first recesses 86; or the like. The first recesses 86 may be formed by etching the fins 66, the nanostructures 55, and the substrate 50 using anisotropic etching processes, such as RIE, NBE, or the like. The first spacers 81, the second spacers 83, and the masks 78 mask portions of the fins 66, the nanostructures 55, and the substrate 50 during the etching processes used to form the first recesses 86. A single etch process or multiple etch processes may be used to etch each layer of the nanostructures 55 and/or the fins 66. Timed etch processes may be used to stop the etching of the first recesses 86 after the first recesses 86 reach a desired depth.

Figure 10A:
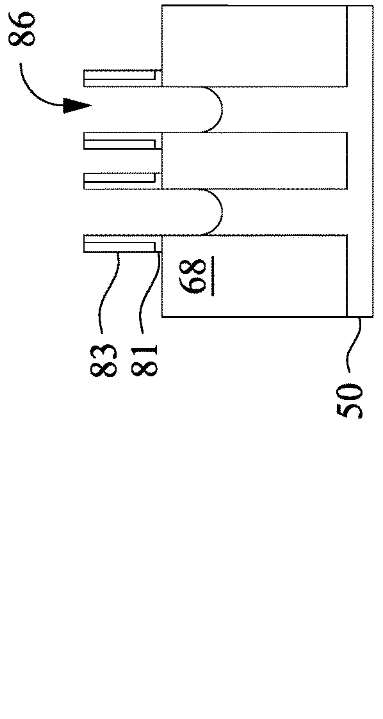
Figure 10B:
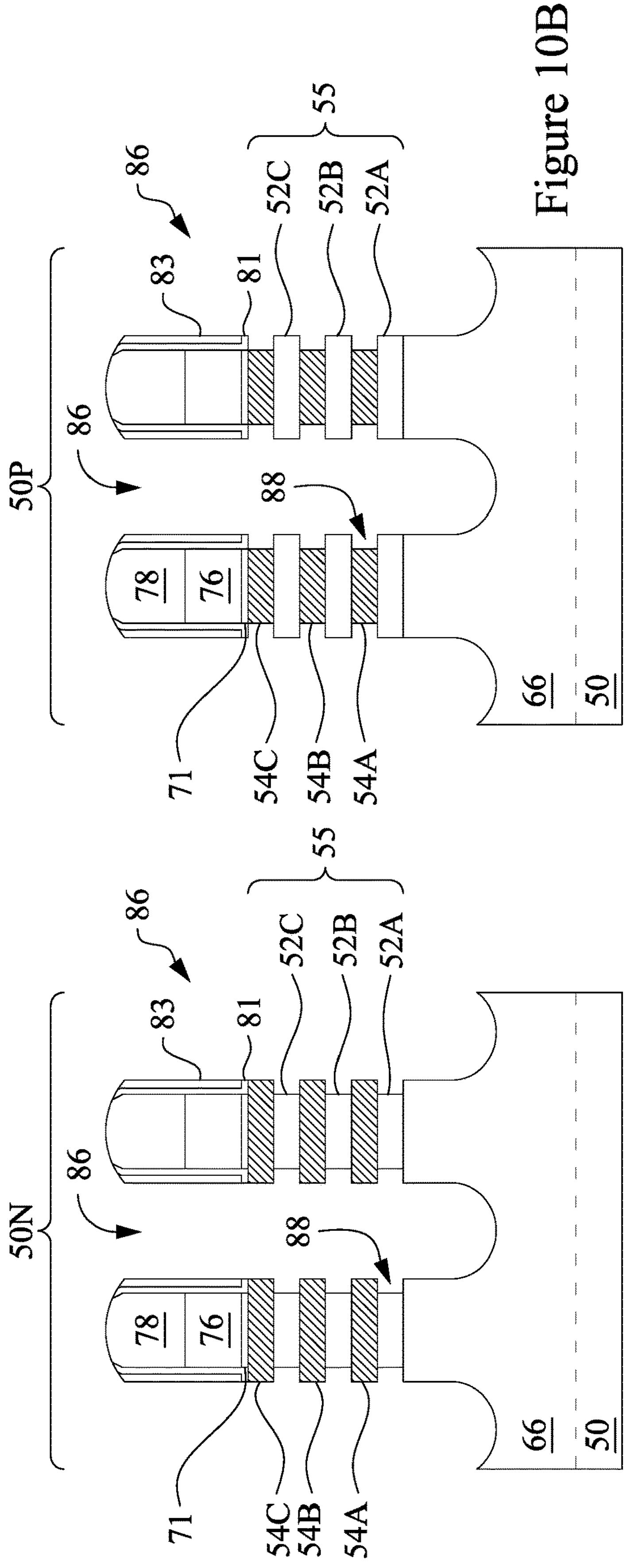

In FIGS. 10A and 10B, portions of sidewalls of the layers of the multi-layer stack 64 formed of the first semiconductor materials (e.g., the first nanostructures 52) exposed by the first recesses 86 are etched to form sidewall recesses 88 in the n-type region 50N, and portions of sidewalls of the layers of the multi-layer stack 56 formed of the second semiconductor materials (e.g., the second nanostructures 54) exposed by the first recesses 86 are etched to form sidewall recesses 88 in the p-type region 50P. Although sidewalls of the first nanostructures 52 and the second nanostructures 54 in sidewall recesses 88 are illustrated as being straight in FIG. 10B, the sidewalls may be concave or convex. The sidewalls may be etched using isotropic etching processes, such as wet etching or the like. The p-type region 50P may be protected using a mask (not shown) while etchants selective to the first semiconductor materials are used to etch the first nanostructures 52 such that the second nanostructures 54 and the substrate 50 remain relatively unetched as compared to the first nanostructures 52 in the n-type region 50N. Similarly, the n-type region 50N may be protected using a mask (not shown) while etchants selective to the second semiconductor materials are used to etch the second nanostructures 54 such that the first nanostructures 52 and the substrate 50 remain relatively unetched as compared to the second nanostructures 54 in the p-type region 50P. In an embodiment in which the first nanostructures 52 include, e.g., SiGe, and the second nanostructures 54 include, e.g., Si or SiC, a dry etch process with tetramethylammonium hydroxide (TMAH), ammonium hydroxide ($NH_4OH$), or the like may be used to etch sidewalls of the first nanostructures 52 in the n-type region 50N, and a wet or dry etch process with hydrogen fluoride, another fluorine-based etchant, or the like may be used to etch sidewalls of the second nanostructures 54 in the p-type region 50P.

Figure 11A:
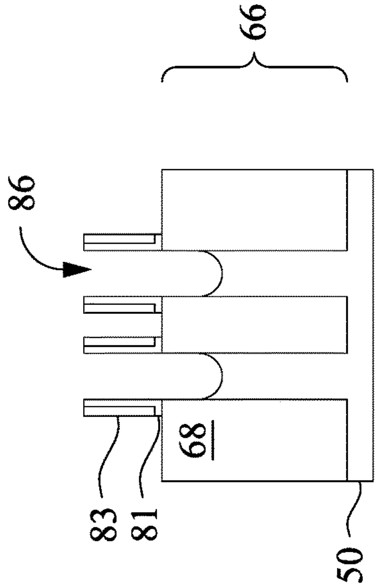
Figure 11B:
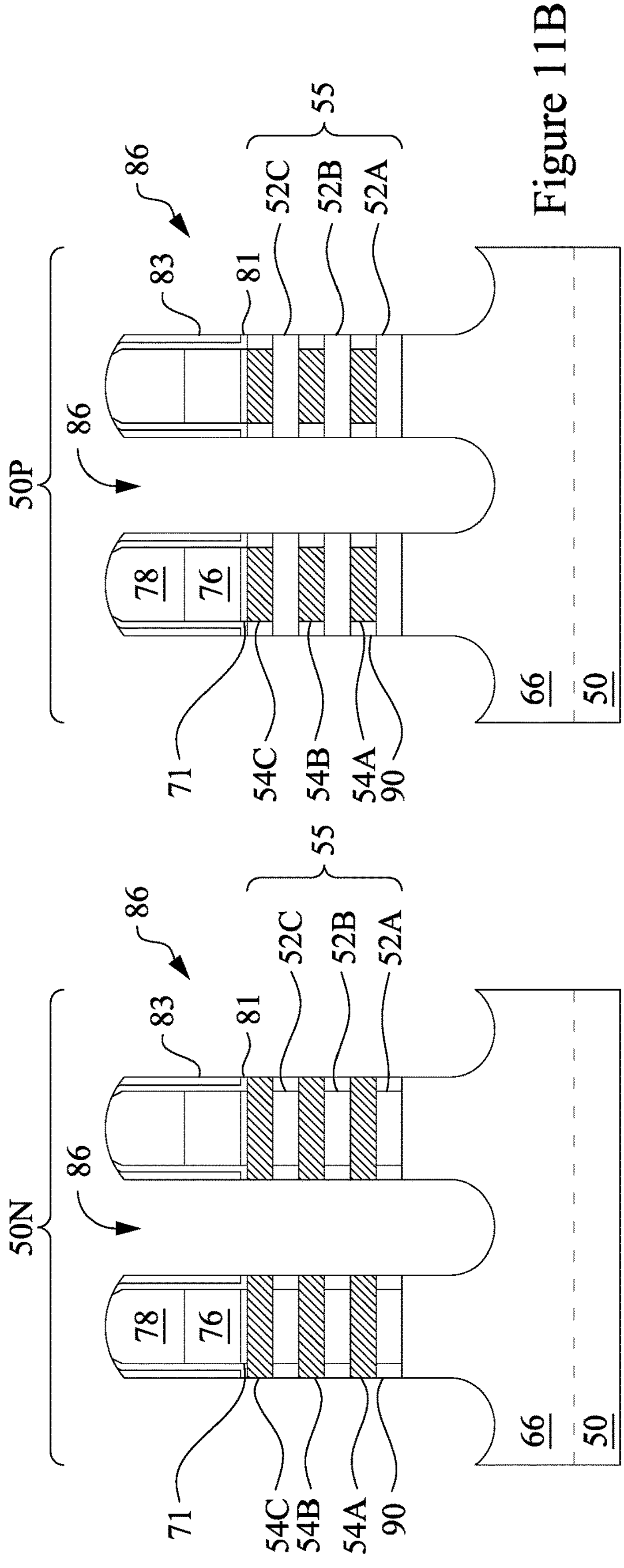
Figure 11C:
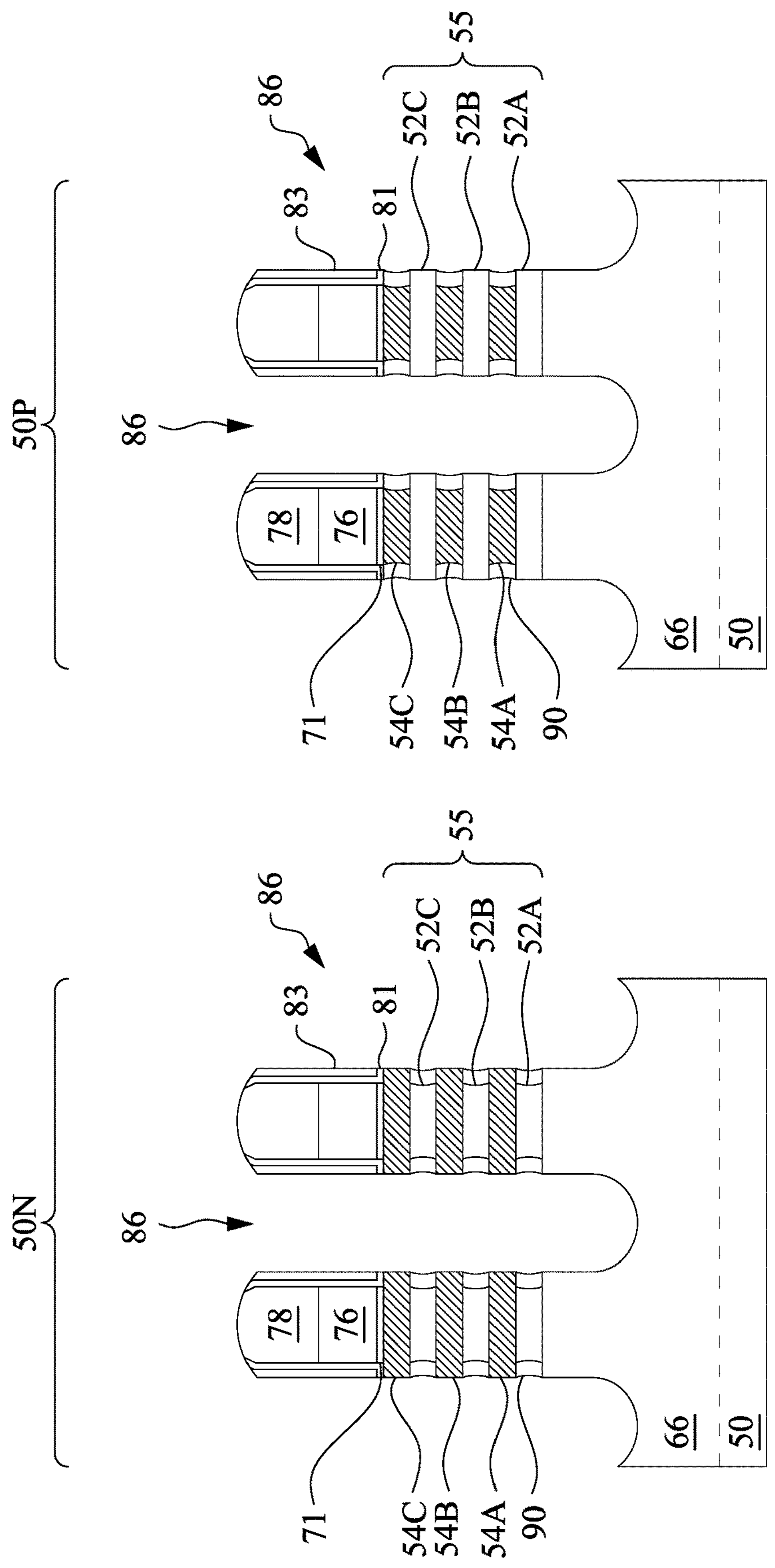

In FIGS. 11A, 11B, and 11C, first inner spacers 90 are formed in the sidewall recess 88. The first inner spacers 90 may be formed by depositing an inner spacer layer (not separately illustrated) over the structures illustrated in FIGS. 10A and 10B. The first inner spacers 90 act as isolation features between subsequently formed source/drain regions and a gate structure. As will be discussed in greater detail below, source/drain regions will be formed in the recesses 86, while the first nanostructures 52 in the n-type region 50N and the second nanostructures 54 in the p-type region 50P will be replaced with corresponding gate structures.

The inner spacer layer may be deposited by a conformal deposition process, such as CVD, ALD, or the like. The inner spacer layer may comprise a material such as silicon nitride or silicon oxynitride, although any suitable material, such as low-dielectric constant (low-k) materials having a k value less than about 3.5, may be utilized. The inner spacer layer may then be anisotropically etched to form the first inner spacers 90. Although outer sidewalls of the first inner spacers 90 are illustrated as being flush with sidewalls of the second nanostructures 54 in the n-type region 50N and flush with the sidewalls of the first nanostructures 52 in the p-type region 50P, the outer sidewalls of the first inner spacers 90 may extend beyond or be recessed from sidewalls of the second nanostructures 54 and/or the first nanostructures 52, respectively.

Moreover, although the outer sidewalls of the first inner spacers 90 are illustrated as being straight in FIG. 11B, the outer sidewalls of the first inner spacers 90 may be concave or convex. As an example, FIG. 11C illustrates an embodiment in which sidewalls of the first nanostructures 52 are concave, outer sidewalls of the first inner spacers 90 are concave, and the first inner spacers 90 are recessed from sidewalls of the second nanostructures 54 in the n-type region 50N. Also illustrated are embodiments in which sidewalls of the second nanostructures 54 are concave, outer sidewalls of the first inner spacers 90 are concave, and the first inner spacers 90 are recessed from sidewalls of the first nanostructures 52 in the p-type region 50P. The inner spacer layer may be etched by an anisotropic etching process, such as RIE, NBE, or the like. The first inner spacers 90 may be used to prevent damage to subsequently formed source/drain regions (such as the epitaxial source/drain regions 102, discussed below with respect to FIGS. 16A-16D) by subsequent etching processes, such as etching processes used to form gate structures.

Figure 12A:
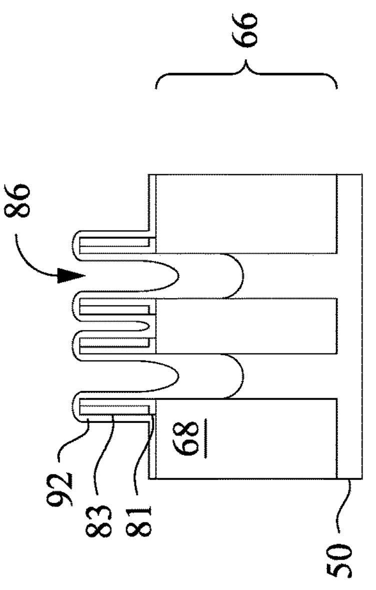
Figure 12B:
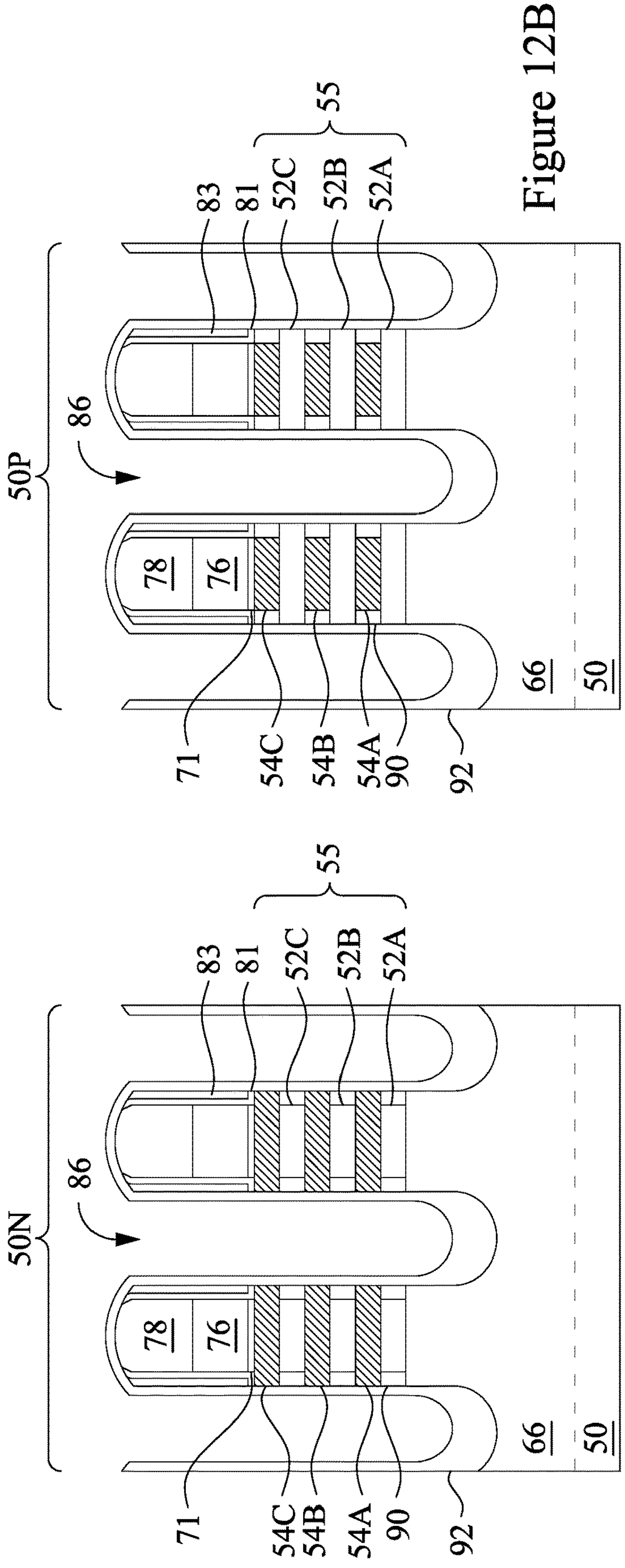

In FIGS. 12A and 12B, a first insulating film 92 is deposited over the structures illustrated in FIGS. 11A and 11B and in the recesses 86, including along the trench bottom of the recesses 86. The first insulating film 92 may be formed using any suitable process and of any suitable material. In some embodiments, the first insulating film 92 is deposited using a flowable CVD process at a process temperature between about 30° C. and about 100° C. (such as between about 40° C. and about 85° C.) and at a process pressure between about 0.1 torr and 50 torr (such as between about 2 torr and 10 torr). The material of the first insulating film 92 may be any acceptable combination of materials having a low-k value (k value less than 6). A low-k value of the first insulating film 92 may be achieved by increasing porosity through the process conditions and/or by increasing the relative percentage of oxygen versus the other materials of the first insulating film 92. In some embodiments, the material of the first insulating film 92 is silicon oxynitride (SiON) (where Si is between 40% and 60%, O is between 40% and 50%, and N is between 10% and 20%, by atomic percentage), having a k value between 4 and 5.5. In other embodiments, the material of the first insulating film 92 is silicon oxycarbonitride (SiOCN) (where Si is between 20% and 40%, O is between 50% and 60%, C is between 20% and 30%, and N is between 5% and 10%, by atomic percentage), having a k value between 3 and 5. The first insulating film 92 may be deposited to have a sidewall thickness along the gate structures (e.g., having an interface with the gate spacer 83 or gate spacer 81) of about 3 nm to about 5 nm, and a bottom thickness in the first recesses 86 between about 18 nm and about 22 nm.

Figure 13A:
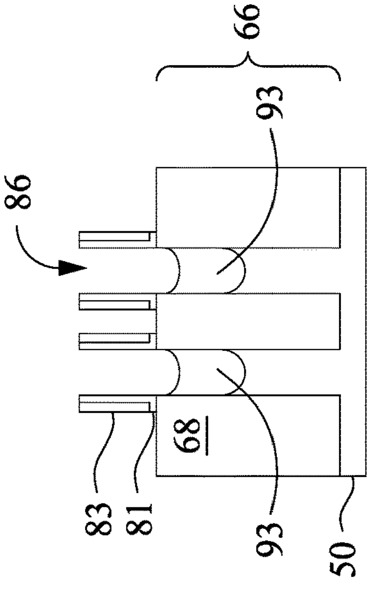
Figure 13B:
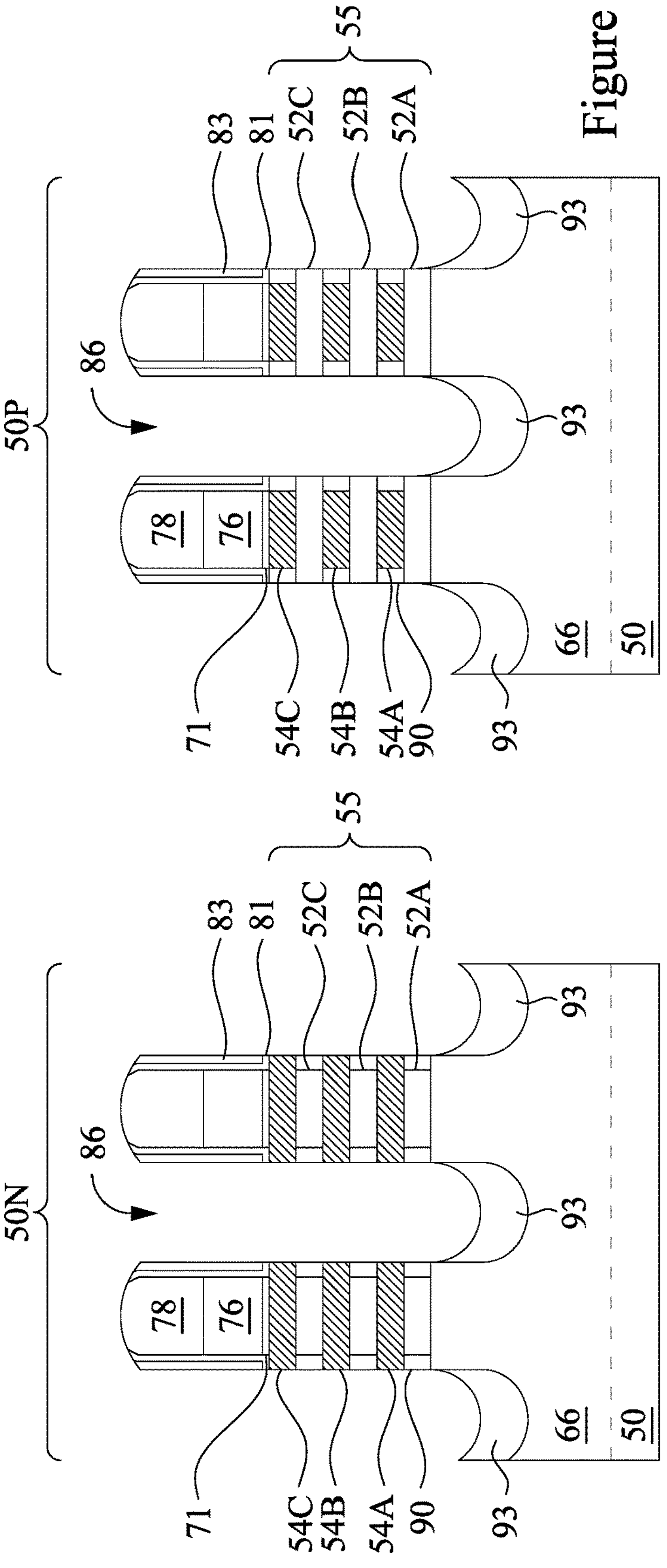

In FIGS. 13A and 13B, the first insulating film 92 is etched using an acceptable etching process to remove the sidewall portions of the first insulating film 92 and form lower isolation structure 93. In the illustrated embodiments, the portions over the masks 78 of the dummy gate structure are also removed, however, in some embodiments, some of the portions of the first insulating film 92 over the masks 78 may remain (and be removed in a subsequent process). The removal may be by any suitable etching process, such as by a dry etch process using a suitable etchant, such as a fluorine containing etchant, at a process temperature between about 50° C. and about 200° C. The remaining portions of the first insulating film 92 in the bottom of the first recesses 86 form the lower isolation structures 93, though the thicknesses of these portions may be reduced from the first insulating film 92 to the lower isolation structure 93. For example, the lower isolation structure 93 may have a thickness which is about 25% to 35% or about 27% to 33% of the thickness of the corresponding bottom portion of the first insulating film 92. In some embodiments, the thickness of the lower isolation structure 93 may be between about 12 nm and 16 nm at its thickest point.

As noted in FIGS. 13A and 13B, the lower isolation structures 93 may extend up the sidewalls of the lower portion of the first recess 86 (corresponding to the fins 66). In some embodiments, the exposed portions of the fins 66 may be completely covered by the lower isolation structures 93, while in other embodiments some of the fins 66 may still be exposed from the lower isolation structures 93. Examples of each of these is provided and discussed below with respect to FIGS. 15C and 15D.

Figure 14A:
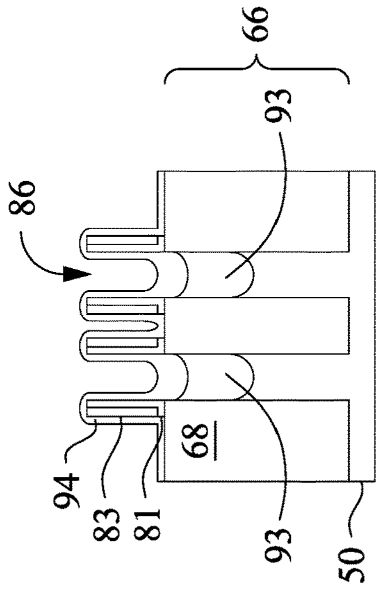
Figure 14B:
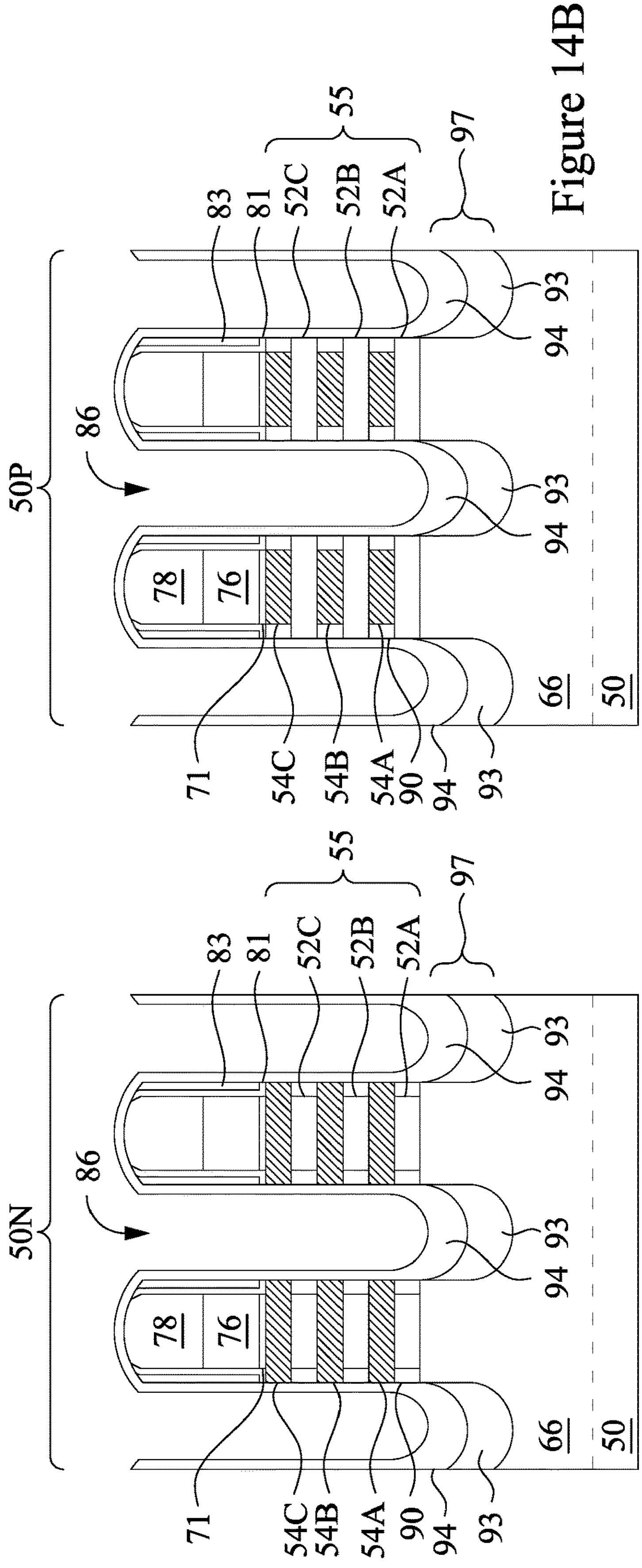

In FIGS. 14A and 14B, a second insulating film 94 is deposited over the structures illustrated in FIGS. 13A and 13B and in the recesses 86, including along the lower isolation structure 93. The second insulating film 94 may be formed using any suitable process and of any suitable material. In some embodiments, the second insulating film 94 is deposited using a flowable CVD process at a process temperature between about 100° C. and about 150° C. (such as between about 110° C. and about 140° C.) and at a process pressure between about 0.1 torr and 50 torr (such as between about 2 torr and 10 torr). In other embodiments, the second insulating film 94 is deposited using an ALD process at a process temperature between about 200° C. and about 500° C. (such as between about 300° C. and about 400° C.) and at a process pressure between about 1 torr and 20 torr (such as between about 3 torr and 10 torr).

The material of the second insulating film 94 is formed using a higher temperature process than the first insulating film 92. As such, the second insulating film 94 will be formed to be denser than the first insulating film 92 and have a higher etch resistance than or etch selectivity from the first insulating film 92. For example, the etch selectivity of the second insulating film 94 to the first insulating film 92 may be greater than about 5, for example between about 5 and 8.

The second insulating film 94 may be any acceptable combination of materials. In some embodiments, the material of the second insulating film 94 is silicon oxynitride (SiON) (where Si is between 40% and 60%, O is between 30% and 50%, and N is between 10% and 30%, by atomic percentage), having a k value between 4 and 5.5. In other embodiments, the material of the second insulating film 94 is silicon oxycarbonitride (SiOCN) (where Si is between 20% and 40%, O is between 40% and 60%, C is between 20% and 30%, and N is between 10% and 20%, by atomic percentage), having a k value between 3 and 5. In yet other embodiments, the material of the second insulating film 94 is silicon nitride (SiN) (where Si is between 40% and 60% and N is between 40% and 50%, by atomic percentage), having a k value between 5 and 6. The second insulating film 94 may be deposited to have a sidewall thickness along the gate structures (e.g., having an interface with the gate spacer 83 or gate spacer 81) of about 2 nm to about 4 nm, and a bottom thickness in the first recesses 86 (over the lower isolation structure 93) between about 12 nm and about 14 nm.

In embodiments where the material of the lower isolation structure 93 (i.e., from the first insulating film 92) is the same as the material of the second insulating film 94, the second insulating film 94 has less percentage oxygen content than the lower isolation structure 93. Further, the material of the second insulating film 94 has more N and/or more C (if applicable) than the lower isolation structure 93, which provides higher etch resistance.

Figure 15A:
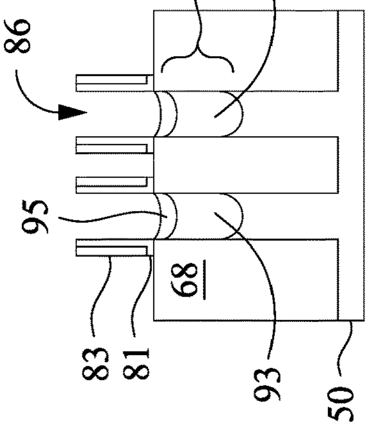
Figure 15B:
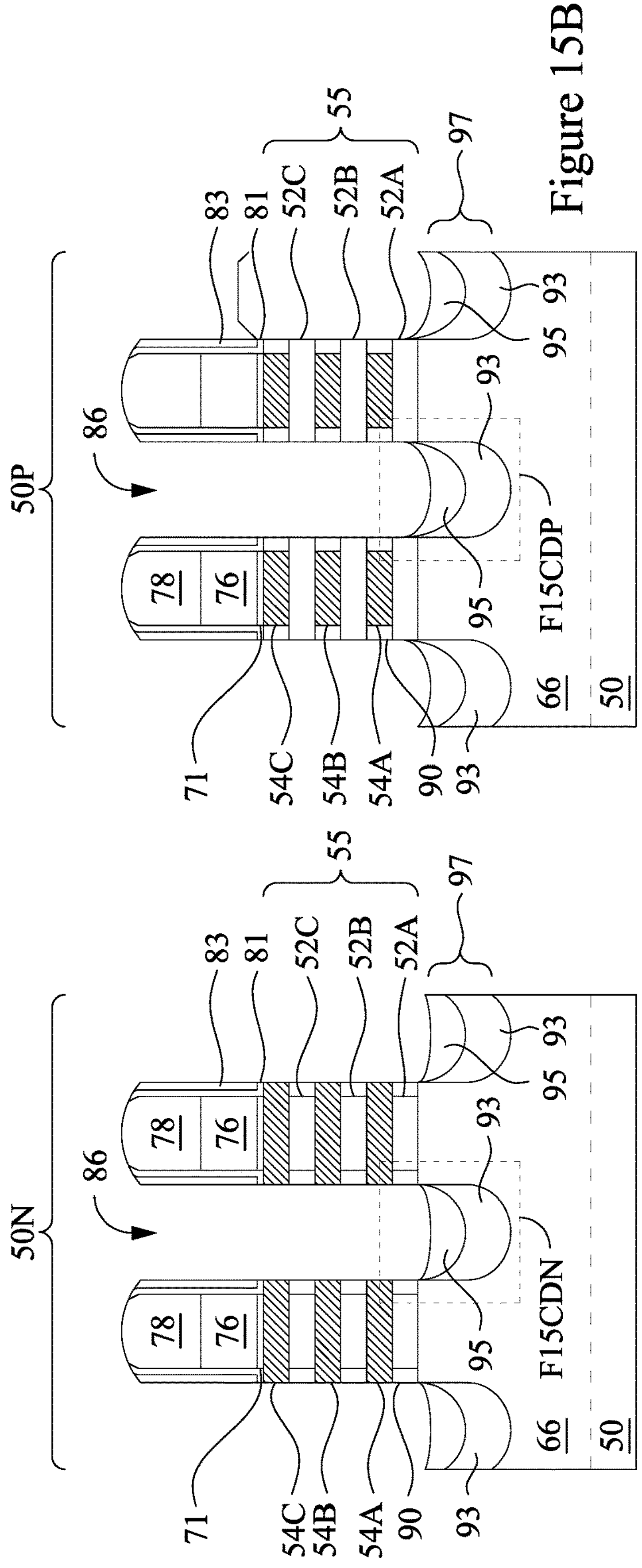

In FIGS. 15A and 15B, the second insulating film 94 is etched using an acceptable etching process to remove the sidewall portions of the second insulating film 94 and form upper isolation structure 95. The lower isolation structure 93 and the upper isolation structure 95 together form what may be called the trench isolation structure 97. In the illustrated embodiments, the portions of the second insulating film 94 over the masks 78 of the dummy gate structure are also removed, however, in some embodiments, some of the portions of the second insulating film 94 over the masks 78 may remain (and be removed in a subsequent process). The removal may be by any suitable etching process, such as by a dry etch process using a suitable etchant, such as a fluorine containing etchant, at a process temperature between about 50° C. and about 200° C. The remaining portions of the second insulating film 94 in the bottom of the first recesses 86 form the upper isolation structures 95, though the thicknesses of these portions may be reduced from the thickness of the second insulating film 94 to the upper isolation structure 95. For example, the upper isolation structure 95 may have a thickness which is about 40% to 80% of the thickness of the corresponding bottom portion of the second insulating film 94. In some embodiments, the thickness of the upper isolation structure 95 may be between about 4 nm and 5 nm at its thickest point.

Figure 15C:
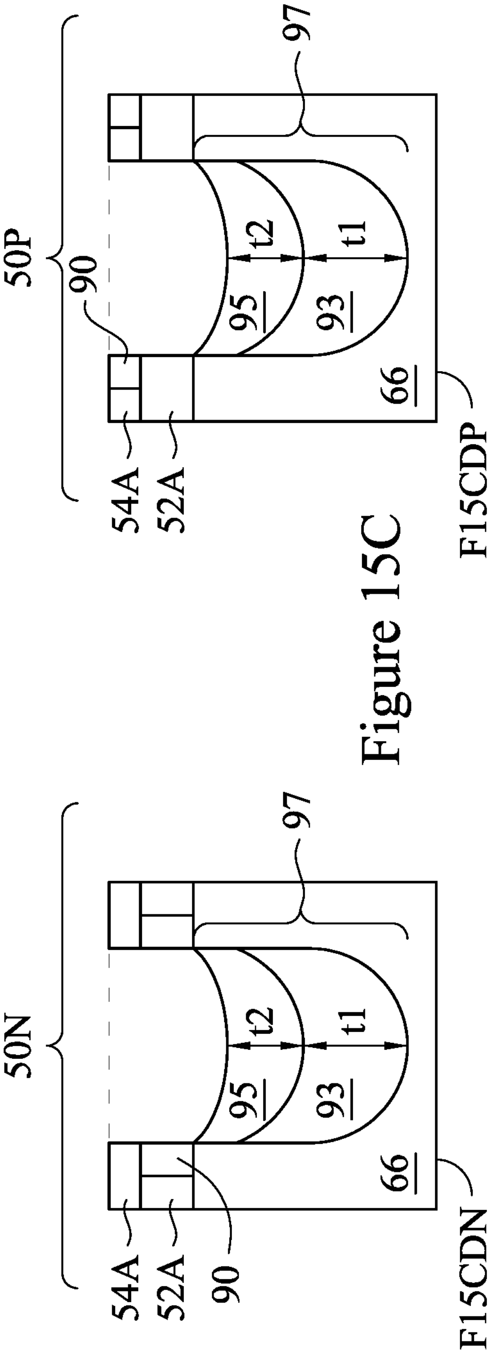

FIG. 15C illustrates the enlarged portion of F15CDN and F15CDP of FIG. 15B in accordance with some embodiments. In some embodiments, the lower isolation structure 93 extends partially up the first recess 86 and covers part of the fins 66, while a portion of the fins 66 remains free (uncovered) from the lower isolation structure 93. Then, the subsequently formed upper isolation structure 95 is formed over the lower isolation structure 93 and the upper isolation structure extends partially up the recesses 89 and covers the remaining part of the fins 66 which were exposed from the lower isolation structure 93. In this manner, all of the fins 66 which were exposed when forming the first recesses 86 are covered by a combination of the lower isolation structure 93 and the upper isolation structure 95. A ratio of the thickness t1 of the lower isolation structure 93 to the thickness t2 of the upper isolation structure 95 is between about 2:1 to about 1:1.

The upper isolation structure 95 may have an interface with the inner spacer 90, e.g. in the n-type region 50N, or a portion of the first nanostructure 52A, e.g., in the p-type region 50P. In some embodiments, the p-type region 50P may be formed using the same nanostructures 54 as the n-type region (see FIGS. 24A, 24B, and 24C), in which case the upper isolation structure 95 may have an interface with the inner spacer 90 next to the first nanostructure 52A in the p-type region 50P. Because the lower isolation structure 93 does not fully cover the fins 66, leaving a portion of the fins exposed, which is subsequently covered by the upper isolation structure 95, the lower isolation structure 93 does not contact the inner spacer 90 nor the first nanostructure 52A.

Figure 15D:
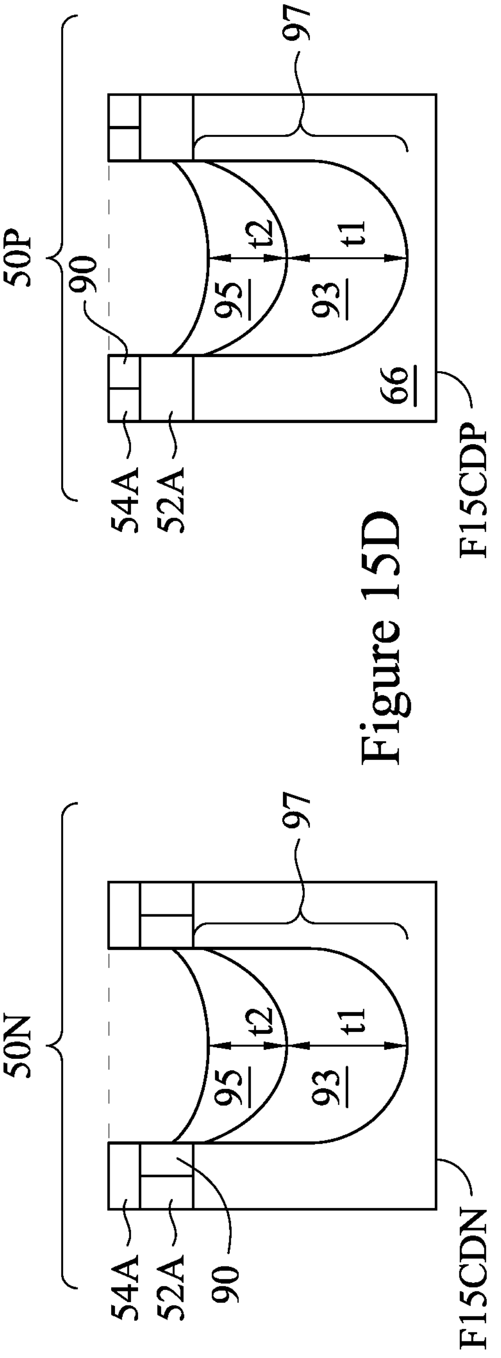

FIG. 15D illustrates the enlarged portion of F15CDN and F15CDP of FIG. 15B, in accordance with other embodiments. In some embodiments, the lower isolation structure 93 extends partially up the first recess 86 and covers all of the exposed fins 66. Then, the subsequently formed upper isolation structure 95 is formed over the lower isolation structure 93 and the upper isolation structure 95 extends partially up the first recesses 86. In this manner, all of the fins 66 which were exposed when forming the first recesses 86 are covered by the lower isolation structure 93 alone and the upper isolation structure 95 does not contact or have an interface with any of the fins 66. A ratio of the thickness t1 of the lower isolation structure 93 to the thickness t2 of the upper isolation structure 95 is between about 2:1 to about 1:1.

The upper isolation structure 95 may have an interface with (i.e., physically contact) the inner spacer 90, e.g. in the n-type region 50N, or a portion of the first nanostructure 52A, e.g., in the p-type region 50P. In some embodiments, the p-type region 50P may be formed using the same nanostructures 54 as the n-type region 50N (see FIGS. 24A, 24B, and 24C), in which case the upper isolation structure 95 may have an interface with the inner spacer 90 next to the first nanostructure 52A in the p-type region 50P. The lower isolation structure 93 may, likewise, also have an interface with (i.e., physically contact) the inner spacer 90 or a portion of the first nanostructure 52A.

Providing the trench isolation structure 97 (including the lower isolation structure 93 and upper isolation structure 95) reduces parasitic capacitance issues as well as provides a reduction in current leakage through the fins 66 and/or substrate 50. Utilizing the upper isolation structure 95 over the lower isolation structure 93 provides a denser isolation structure with improved etch resistance, which is helpful for protecting the lower isolation structure 93 from subsequent cleaning processes and the growth of epitaxial regions in the remaining first recesses 86. Utilizing the lower isolation structure 93 provides a low-k isolation feature, which provides better isolation, for example, over a high-k material, but also may be more susceptible to damage. Thus, utilizing the combination of the upper isolation structure 95 and lower isolation feature 93 for the trench isolation structure 97 provides both good isolation and robustness.

Figure 16A:
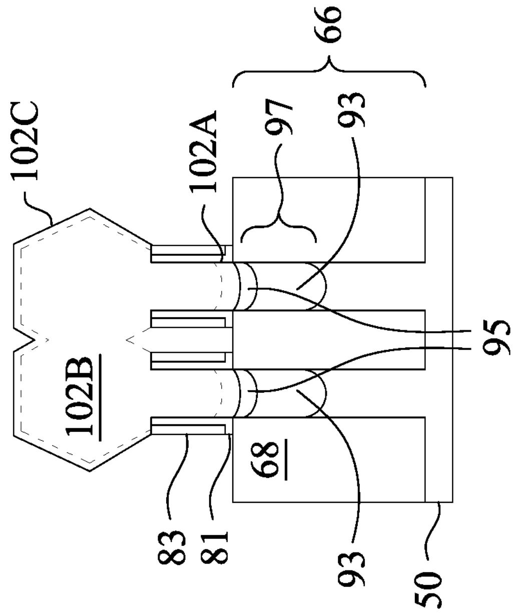
Figure 16B:
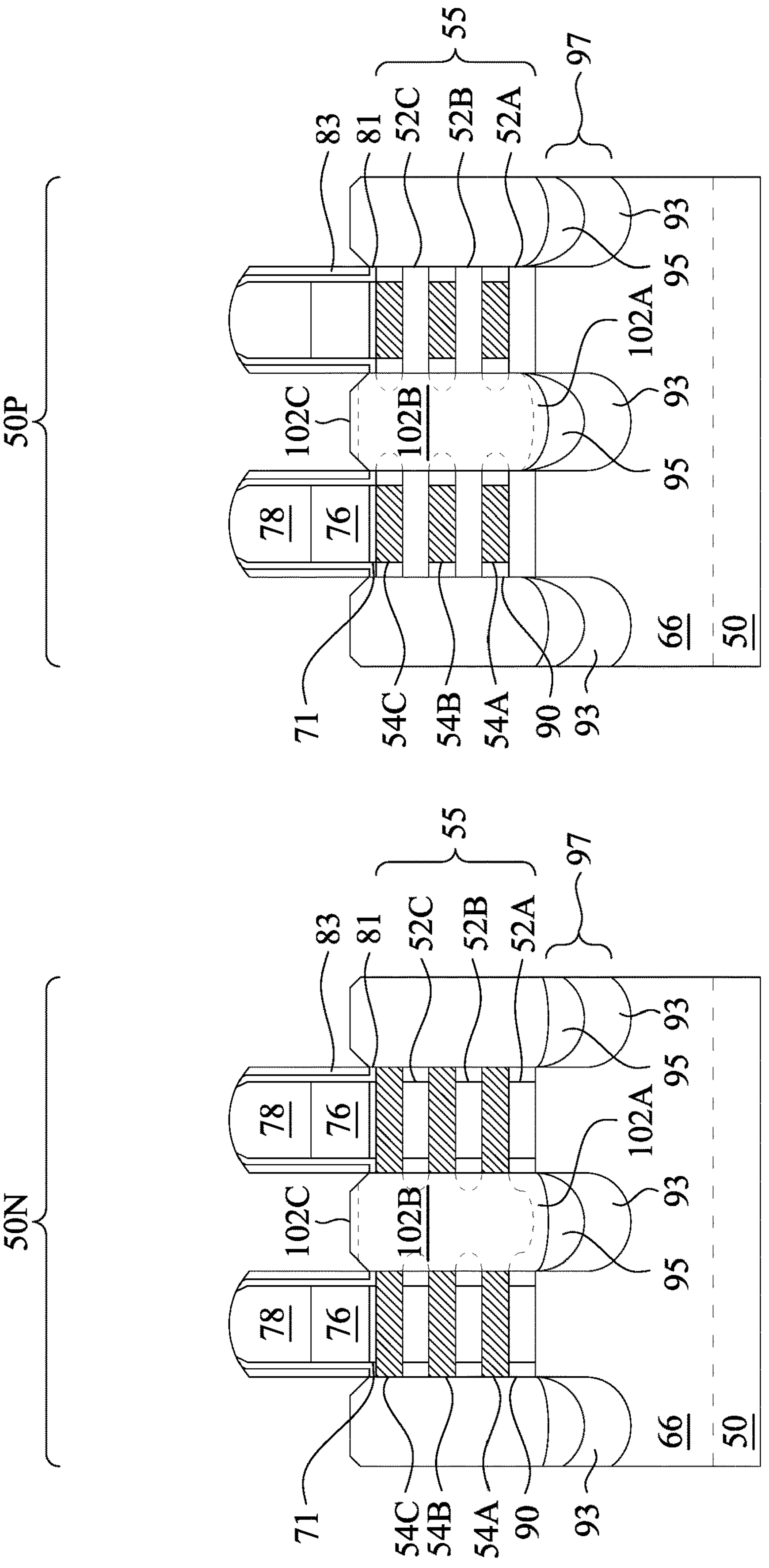

In FIGS. 16A, 16B, 16C, and 16D, epitaxial source/drain regions 102 are formed in the first recesses 86 over the upper isolation structure 95 of the trench isolation structure 97. In some embodiments, the source/drain regions 102 may exert stress on the second nanostructures 54 in the n-type region 50N and on the first nanostructures 52 in the p-type region 50P, thereby improving performance. As illustrated in FIG. 16B, the epitaxial source/drain regions 102 are formed in the first recesses 86 such that each dummy gate 76 is disposed between respective neighboring pairs of the epitaxial source/drain regions 102. In some embodiments, the first spacers 81 are used to separate the epitaxial source/drain regions 102 from the dummy gates 76 and the first inner spacers 90 are used to separate the epitaxial source/drain regions 102 from the nanostructures 55 by an appropriate lateral distance so that the epitaxial source/drain regions 102 do not short out with subsequently formed gates of the resulting nano-FETs.

The epitaxial source/drain regions 102 in the n-type region 50N, e.g., the NMOS region, may be formed by masking the p-type region 50P, e.g., the PMOS region. Then, the epitaxial source/drain regions 102 are epitaxially grown in the first recesses 86 in the n-type region 50N. The epitaxial source/drain regions 102 may include any acceptable material appropriate for n-type nano-FETs. For example, if the second nanostructures 54 are silicon, the epitaxial source/drain regions 102 may include materials exerting a tensile strain on the second nanostructures 54, such as silicon, silicon carbide, phosphorous doped silicon carbide, silicon phosphide, or the like. The epitaxial source/drain regions 102 may have surfaces raised from respective upper surfaces of the nanostructures 55 and may have facets.

The epitaxial source/drain regions 102 in the p-type region 50P, e.g., the PMOS region, may be formed by masking the n-type region 50N, e.g., the NMOS region. Then, the epitaxial source/drain regions 102 are epitaxially grown in the first recesses 86 in the p-type region 50P. The epitaxial source/drain regions 102 may include any acceptable material appropriate for p-type nano-FETs. For example, if the first nanostructures 52 are silicon germanium, the epitaxial source/drain regions 102 may comprise materials exerting a compressive strain on the first nanostructures 52, such as silicon-germanium, boron doped silicon-germanium, germanium, germanium tin, or the like. The epitaxial source/drain regions 102 may also have surfaces raised from respective surfaces of the multi-layer stack 56 and may have facets.

The epitaxial source/drain regions 102, the first nanostructures 52, the second nanostructures 54, and/or the substrate 50 may be implanted with dopants to form source/drain regions, similar to the process previously discussed for forming lightly-doped source/drain regions, followed by an anneal. The source/drain regions may have an impurity concentration of between about $1\times10^{19}$ atoms/cm$^3$ and about $1\times10^{21}$ atoms/cm$^3$. The n-type and/or p-type impurities for source/drain regions may be any of the impurities previously discussed. In some embodiments, the epitaxial source/drain regions 102 may be in situ doped during growth.

Figure 16C:
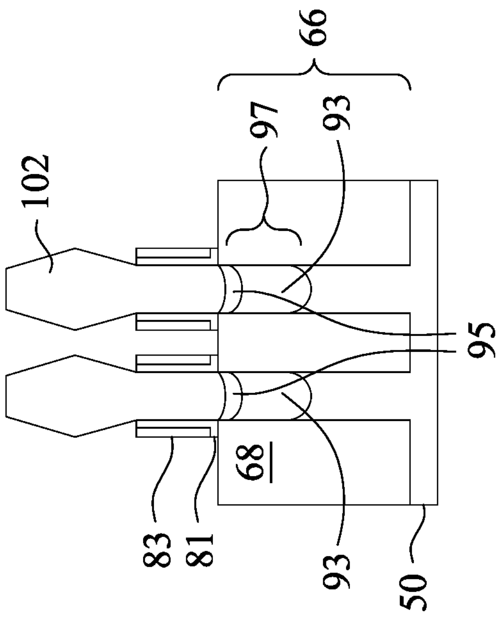

As a result of the epitaxy processes used to form the epitaxial source/drain regions 102 in the n-type region 50N and the p-type region 50P, upper surfaces of the epitaxial source/drain regions 102 have facets which expand laterally outward beyond sidewalls of the nanostructures 55. In some embodiments, these facets cause adjacent epitaxial source/drain regions 102 of a same nano-FET to merge as illustrated by FIG. 16A. In other embodiments, adjacent epitaxial source/drain regions 102 remain separated after the epitaxy process is completed as illustrated by FIG. 16C. In the embodiments illustrated in FIGS. 16A and 16C, the first spacers 81 may be formed to a top surface of the STI regions 68 thereby blocking the epitaxial growth. In some other embodiments, the first spacers 81 may cover portions of the sidewalls of the nanostructures 55 further blocking the epitaxial growth. In some other embodiments, the spacer etch used to form the first spacers 81 may be adjusted to remove the spacer material to allow the epitaxially grown region to extend to the surface of the STI region 68.

Figure 16D:
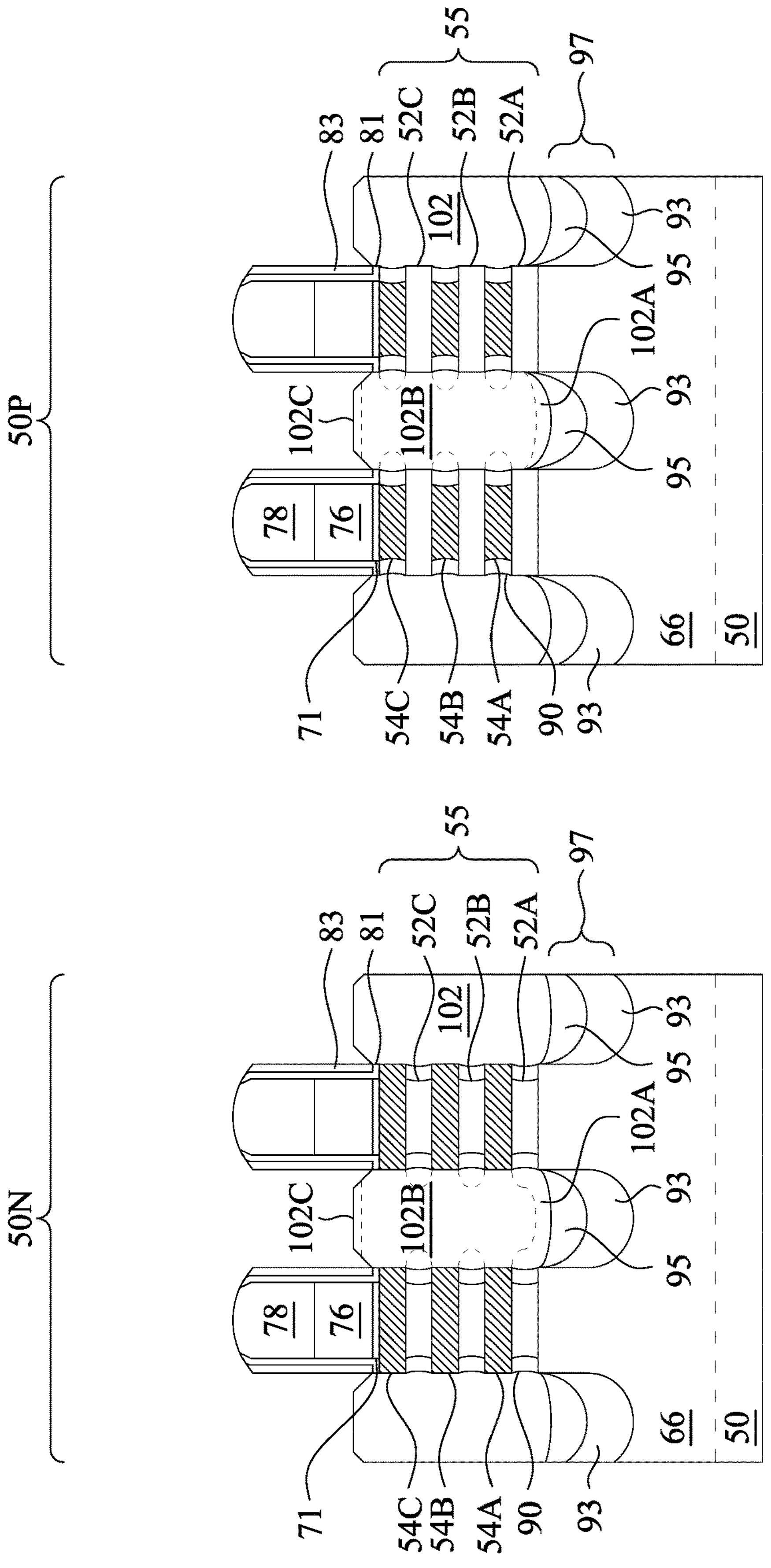

The epitaxial source/drain regions 102 may comprise one or more semiconductor material layers. For example, the epitaxial source/drain regions 102 may comprise a first semiconductor material layer 102A, a second semiconductor material layer 102B, and a third semiconductor material layer 102C. Any number of semiconductor material layers may be used for the epitaxial source/drain regions 102. Each of the first semiconductor material layer 102A, the second semiconductor material layer 102B, and the third semiconductor material layer 102C may be formed of different semiconductor materials and may be doped to different dopant concentrations. In some embodiments, the first semiconductor material layer 102A may have a dopant concentration less than the second semiconductor material layer 102B and greater than the third semiconductor material layer 102C. In embodiments in which the epitaxial source/drain regions 102 comprise three semiconductor material layers, the first semiconductor material layer 102A may be deposited, the second semiconductor material layer 102B may be deposited over the first semiconductor material layer 102A, and the third semiconductor material layer 102C may be deposited over the second semiconductor material layer 102B. In some embodiments, the first semiconductor material layer 102A will form at a bottom of the recess 86 (see FIGS. 15A and 15B) over the upper isolation structure 95 and have a curved/bowl shaped outer surface (the outer surface being opposite the surface on which the first semiconductor material layer 102A is deposited). Further, the first semiconductor material layer 102A may form along the sidewall spacers 90 and have an outward curve/button shape. As such, the first semiconductor material layer 102A formed on the sidewall spacers 90 may have an opposite outer surface shape than the first semiconductor material layer 102A formed at the bottom of the recess 86. In other words, while first semiconductor material layer 102A disposed on the bottom of the recess 86 is concave, first semiconductor material layer 102A disposed on the sidewall spacers 90 is convex. This may also be the case even when the sidewall spacers 90 have a curved surface, as shown in FIG. 16D. In some embodiments, the first semiconductor material layer 102A at the bottom of the recess 86 may merge with the first semiconductor material layer 102A on the sidewall spacers 90.

Due to the upper isolation structure 95 of the trench isolation structure 97, when the epitaxial source/drain regions 102 are formed, including for example the first semiconductor material layer 102A, the lower isolation structure 93 of the trench isolation structure 97 is protected from damage during the growth process, because the upper isolation structure 95 is more robust than the lower isolation structure 93. Further, the trench isolation structure 97 provides good isolation of the epitaxial source/drain regions 102 from the fins 66, especially due to the low-k insulating materials of the lower isolation structure 93.

In some embodiments, prior to growing the epitaxial source/drain regions 102, a cleaning process may be used to remove etching residue which may remain after etching the sidewall spacer layer, the first insulating layer 92, and/or the second insulating layer 94. The cleaning process may use, for example, diluted hydrofluoric acid (dHF), deionized water, or other suitable cleaning agent to remove such residues. While the lower isolation structure 93 has a lower k value than the upper isolation structure 95, the upper isolation structure 95 has a higher etch resistance than the lower isolation structure 93, and thus protects the lower isolation structure 93 from damage which may result from the cleaning process.

FIG. 16D illustrates an embodiment in which sidewalls of the first nanostructures 52 in the n-type region 50N and sidewalls of the second nanostructures 54 in the p-type region 50P are concave, outer sidewalls of the first inner spacers 90 are concave, and the first inner spacers 90 are recessed from sidewalls of the second nanostructures 54 and the first nanostructures 52, respectively. As illustrated in FIG. 16D, the epitaxial source/drain regions 102 may be formed in contact with the first inner spacers 90 and may extend past sidewalls of the second nanostructures 54 in the n-type region 50N and past sidewalls of the first nanostructures 52 in the p-type region 50P.

Figure 17A:
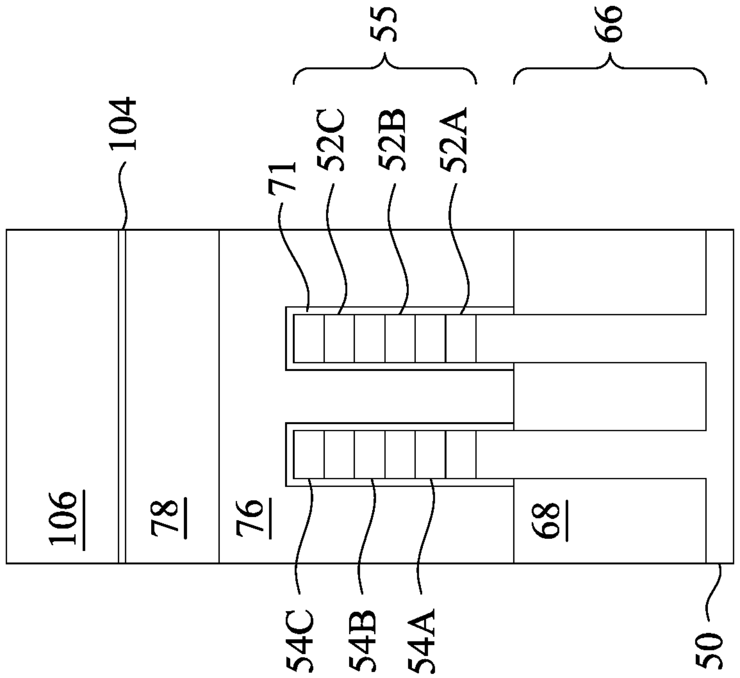
Figure 17B:
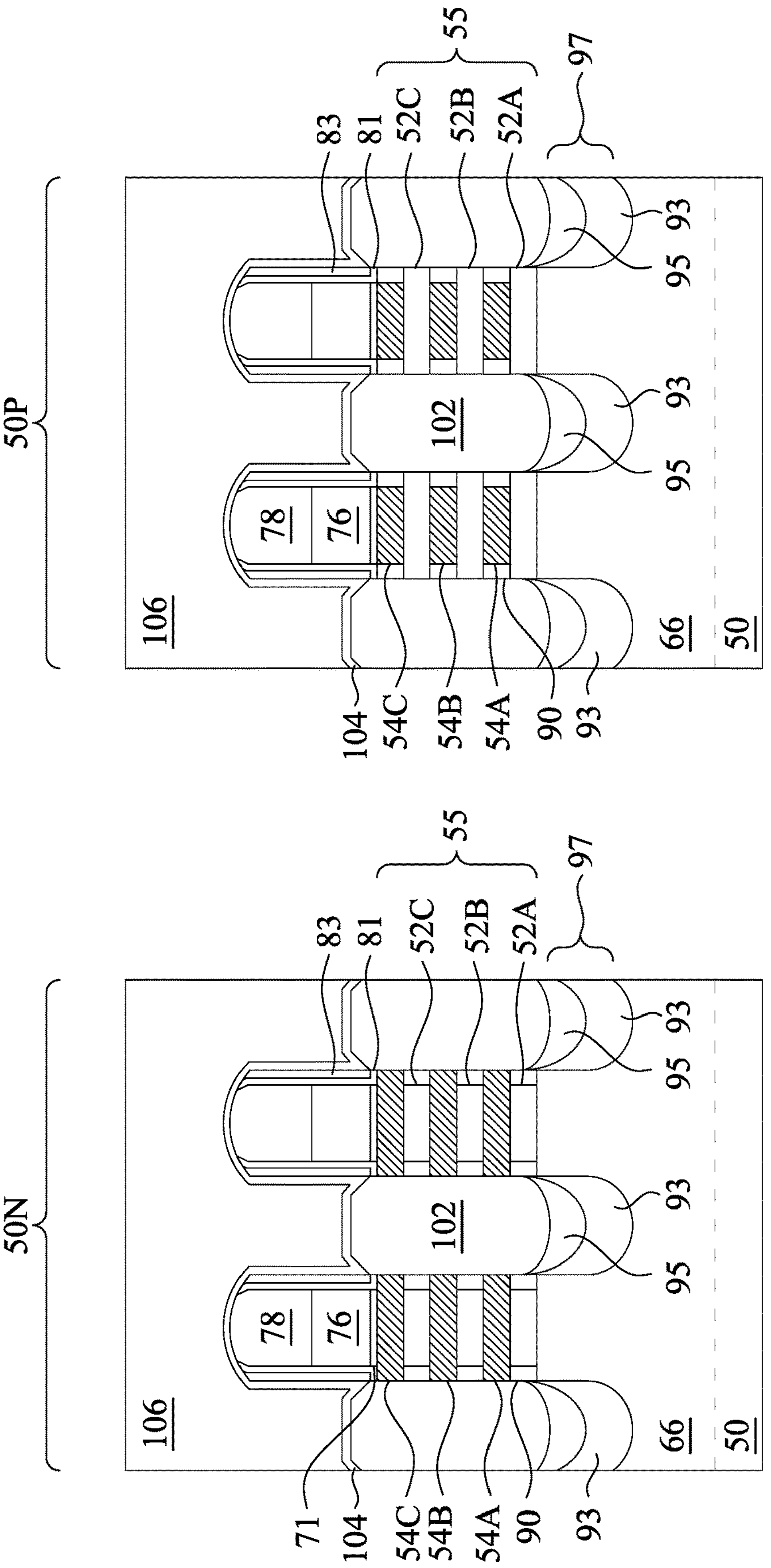
Figure 17C:
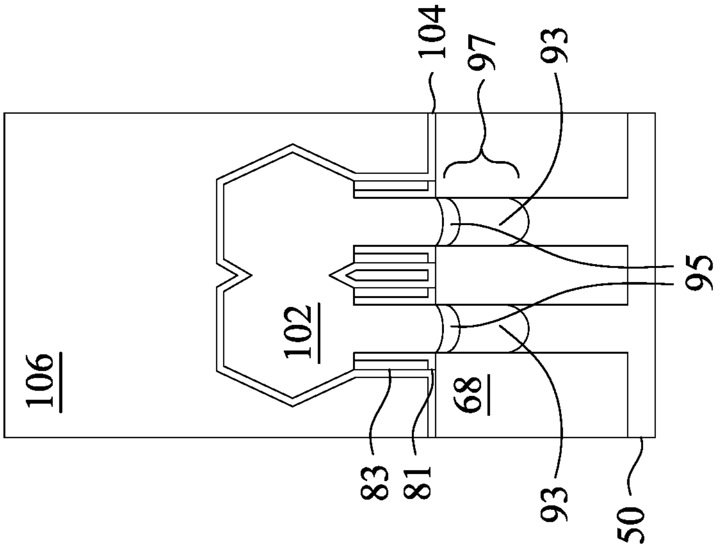

In FIGS. 17A, 17B, and 17C, a first interlayer dielectric (ILD) 106 is deposited over the structure illustrated in FIGS. 16A, 16B, and 16C (the processes associated with FIGS. 7A-16D do not alter the cross-section illustrated in FIG. 6A), respectively. The first ILD 106 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 104 is disposed between the first ILD 106 and the epitaxial source/drain regions 102, the masks 78, and the first spacers 81. The CESL 104 may comprise a dielectric material, such as, silicon nitride, silicon oxide, silicon oxynitride, or the like, having a different etch rate than the material of the overlying first ILD 106.

Figure 18A:
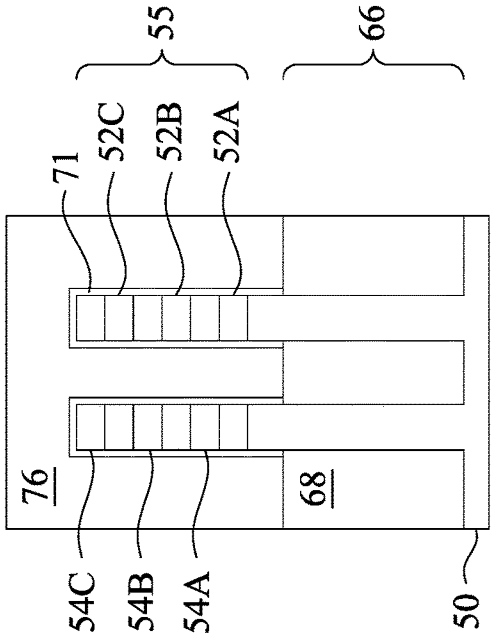
Figure 18B:
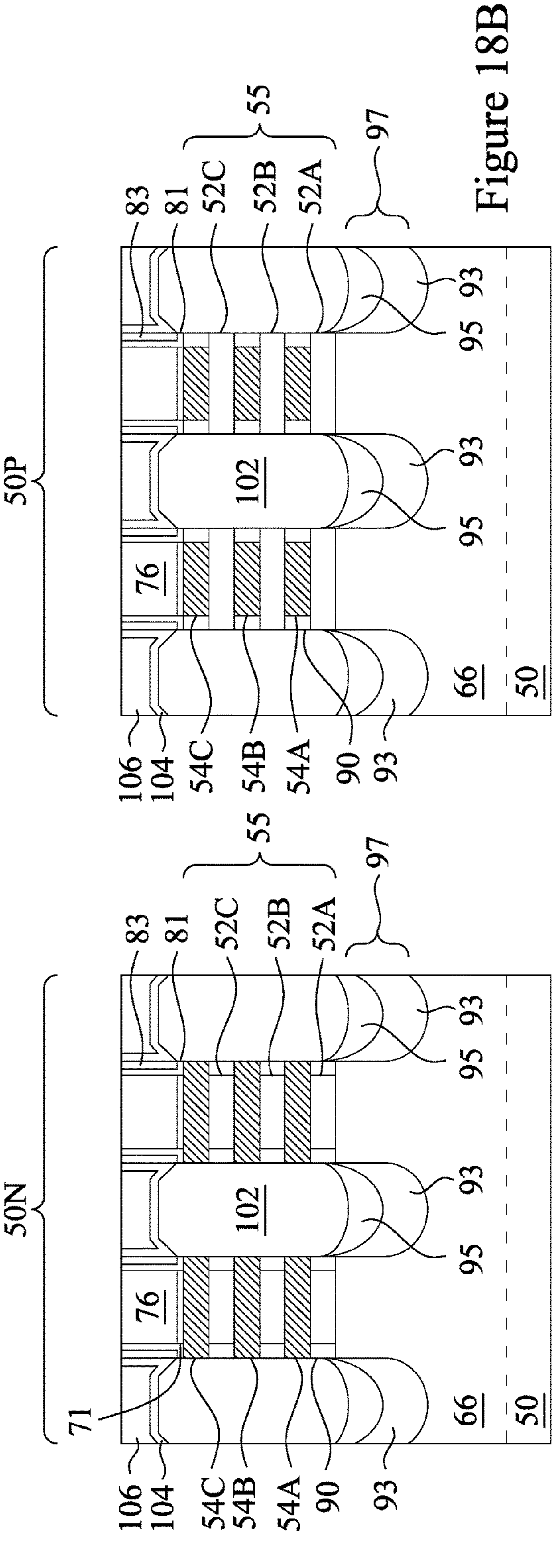

In FIGS. 18A and 18B, a planarization process, such as a CMP, may be performed to level the top surface of the first ILD 106 with the top surfaces of the dummy gates 76 or the masks 78. The planarization process may also remove the masks 78 on the dummy gates 76, and portions of the first spacers 81 along sidewalls of the masks 78. In embodiments where some of the first insulating layer 92 and/or second insulating layer 94 remained over the masks 78, the planarization process will also remove such remaining portions of the first insulating layer 92 and/or second insulating layer 94. After the planarization process, top surfaces of the dummy gates 76, the first spacers 81, and the first ILD 106 are level within process variations. Accordingly, the top surfaces of the dummy gates 72 are exposed through the first ILD 106. In some embodiments, the masks 78 may remain, in which case the planarization process levels the top surface of the first ILD 106 with top surface of the masks 78 and the first spacers 81.

Figure 19A:
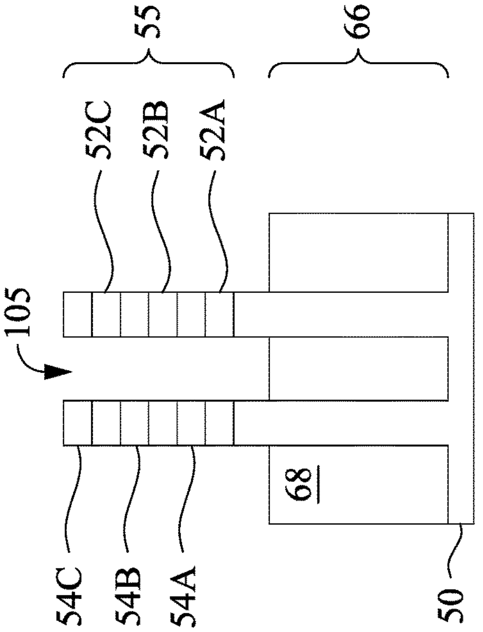
Figure 19B:
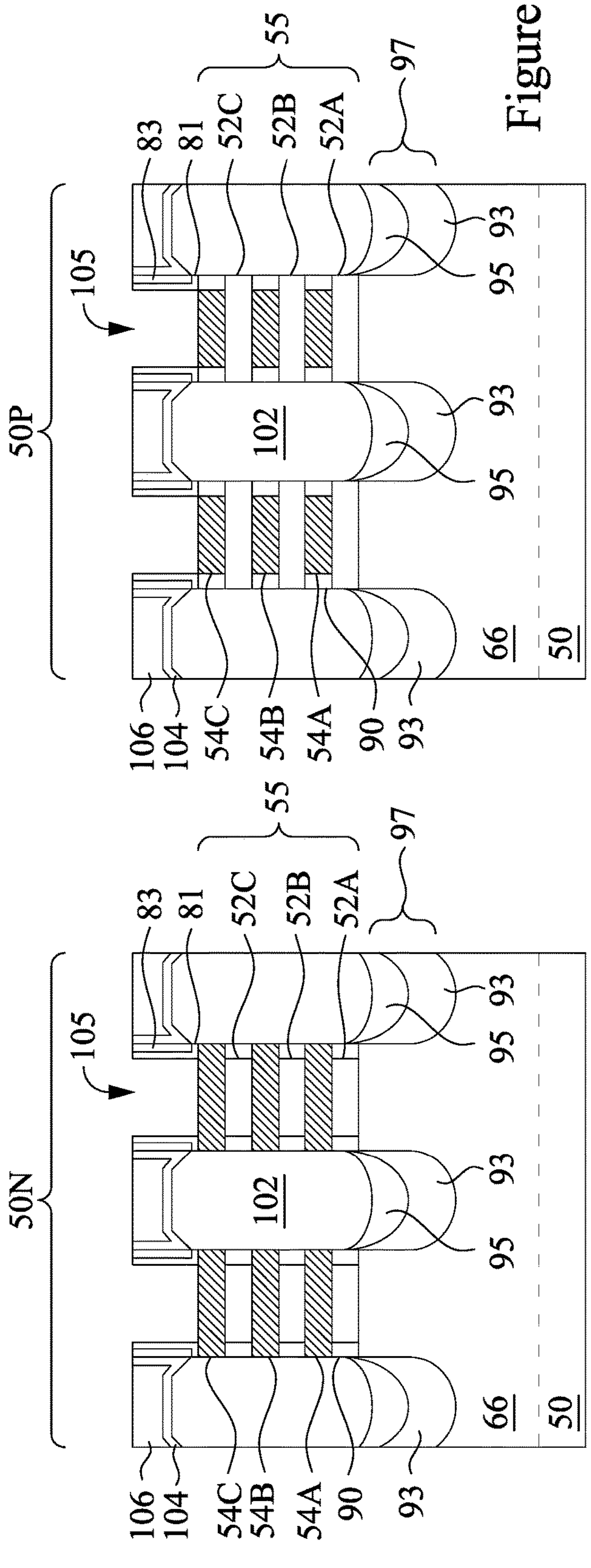

In FIGS. 19A and 19B, the dummy gates 76, and the masks 78 if present, are removed in one or more etching steps, so that second recesses 105 are formed. Portions of the dummy gate dielectrics 71 in the second recesses 105 are also be removed. In some embodiments, the dummy gates 76 and the dummy gate dielectrics 71 are removed by an anisotropic dry etch process. For example, the etching process may include a dry etch process using reaction gas(es) that selectively etch the dummy gates 76 at a faster rate than the first ILD 106 or the first spacers 81. Each second recess 105 exposes and/or overlies portions of nanostructures 55, which act as channel regions in subsequently completed nano-FETs. Portions of the nanostructures 55 which act as the channel regions are disposed between neighboring pairs of the epitaxial source/drain regions 102.

During the removal, the dummy gate dielectrics 71 may be used as etch stop layers when the dummy gates 76 are etched. The dummy gate dielectrics 71 may then be removed after the removal of the dummy gates 76.

Figure 20A:
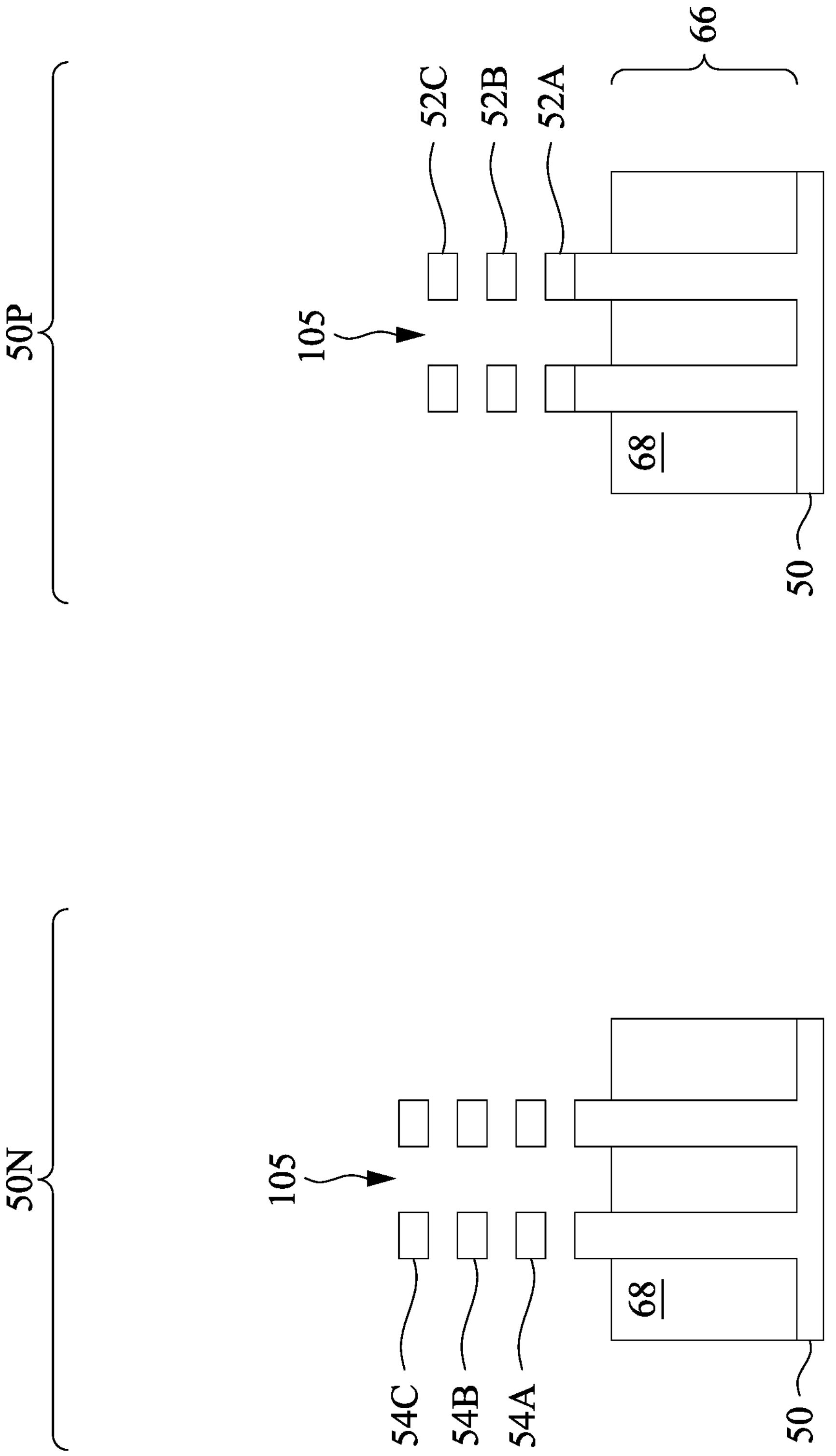
Figure 20B:
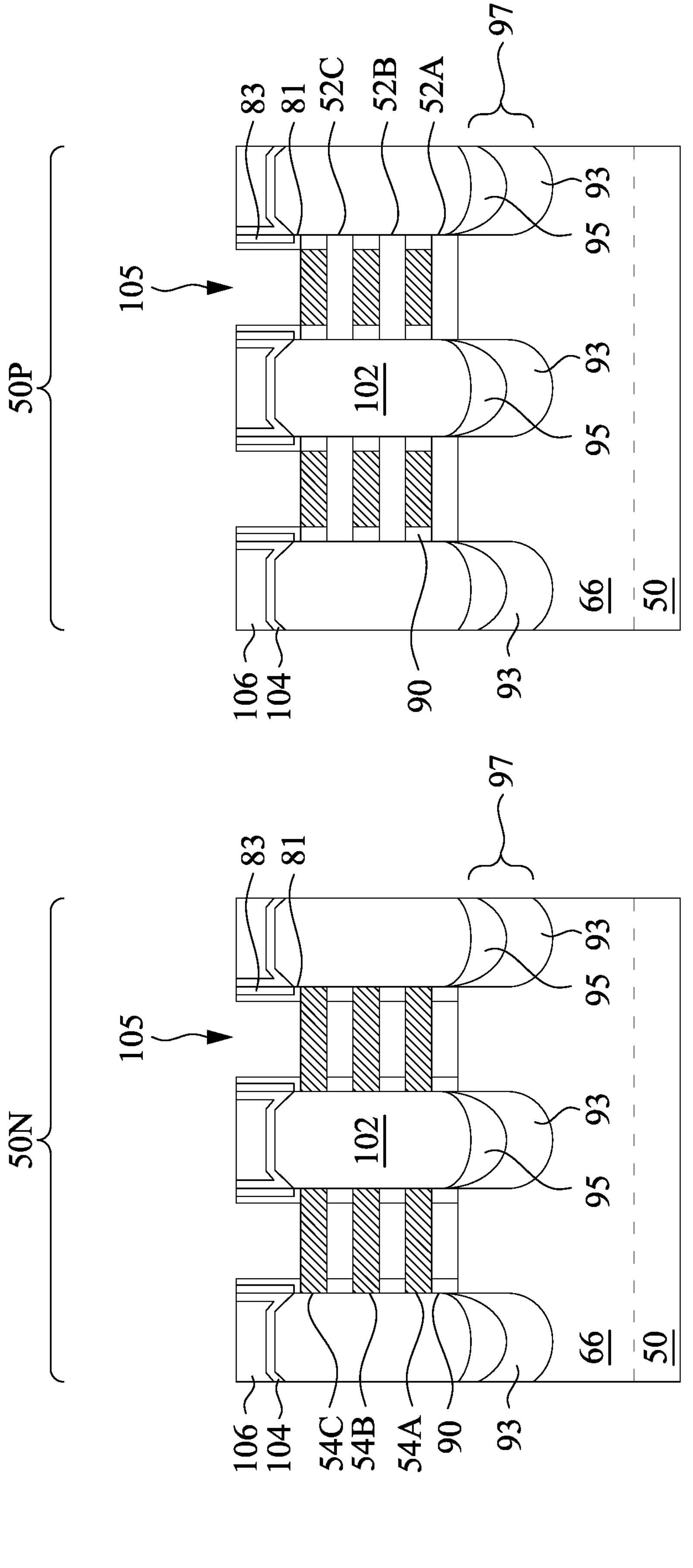

In FIGS. 20A and 20B, the first nanostructures 52 in the n-type region 50N and the second nanostructures 54 in the p-type region 50P are removed extending the second recesses 105. The first nanostructures 52 may be removed by forming a mask (not shown) over the p-type region 50P and performing an isotropic etching process such as wet etching or the like using etchants which are selective to the materials of the first nanostructures 52, while the second nanostructures 54, the substrate 50, the STI regions 68 remain relatively unetched as compared to the first nanostructures 52. In embodiments in which the first nanostructures 52 include, e.g., SiGe, and the second nanostructures 54A-54C include, e.g., Si or SiC, tetramethylammonium hydroxide (TMAH), ammonium hydroxide ($NH_4OH$), or the like may be used to remove the first nanostructures 52 in the n-type region 50N.

The second nanostructures 54 in the p-type region 50P may be removed by forming a mask (not shown) over the n-type region 50N and performing an isotropic etching process such as wet etching or the like using etchants which are selective to the materials of the second nanostructures 54, while the first nanostructures 52, the substrate 50, the STI regions 68 remain relatively unetched as compared to the second nanostructures 54. In embodiments in which the second nanostructures 54 include, e.g., SiGe, and the first nanostructures 52 include, e.g., Si or SiC, hydrogen fluoride, another fluorine-based etchant, or the like may be used to remove the second nanostructures 54 in the p-type region 50P.

In other embodiments, the channel regions in the n-type region 50N and the p-type region 50P may be formed simultaneously, for example by removing the first nanostructures 52 in both the n-type region 50N and the p-type region 50P or by removing the second nanostructures 54 in both the n-type region 50N and the p-type region 50P. In such embodiments, channel regions of n-type nano-FETs and p-type nano-FETS may have a same material composition, such as silicon, silicon germanium, or the like. FIGS. 24A, 24B, and 24C illustrate a structure resulting from such embodiments where the channel regions in both the p-type region 50P and the n-type region 50N are provided by the second nanostructures 54 and comprise silicon, for example.

Figure 21A:
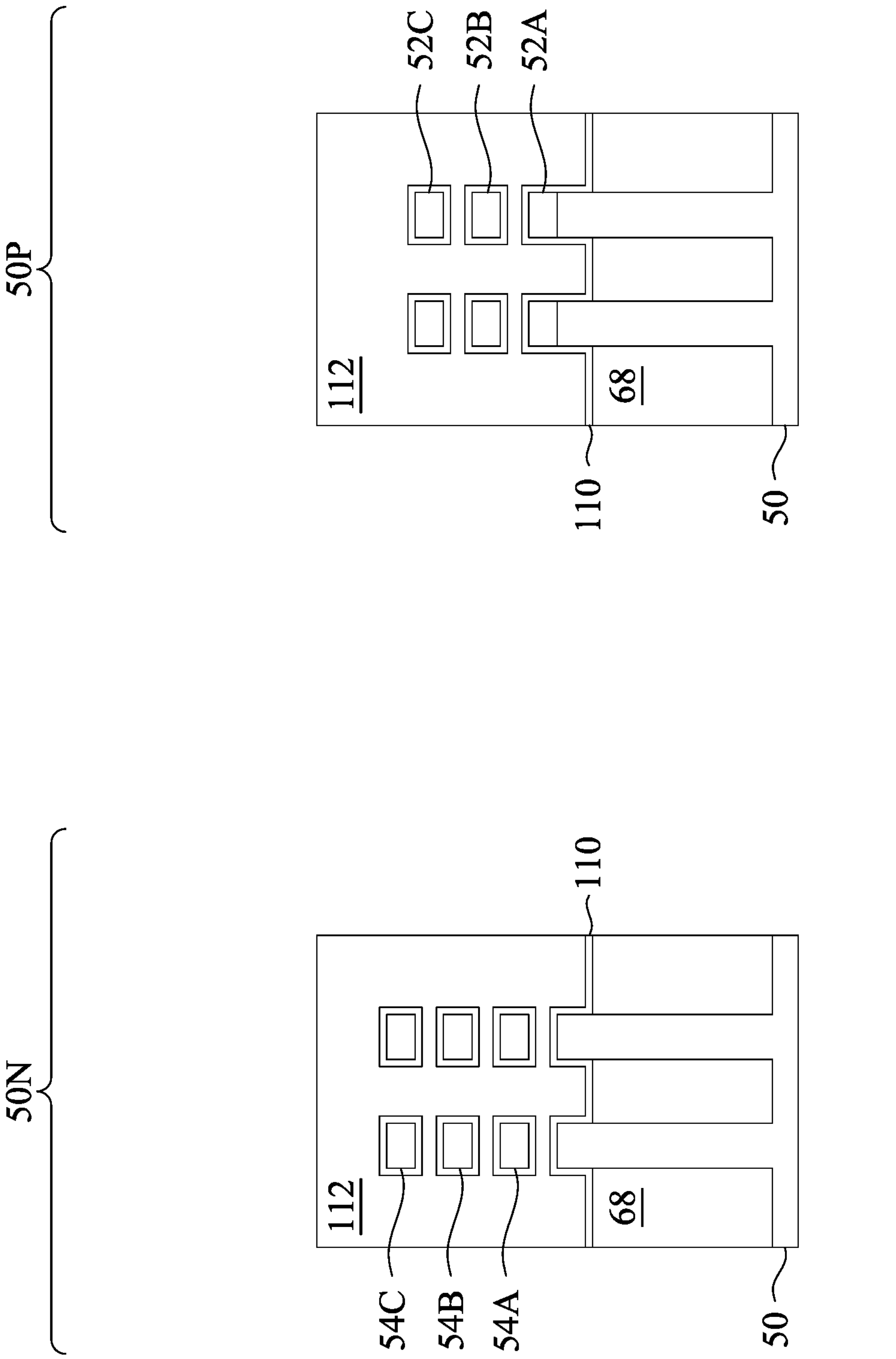
Figure 21B:
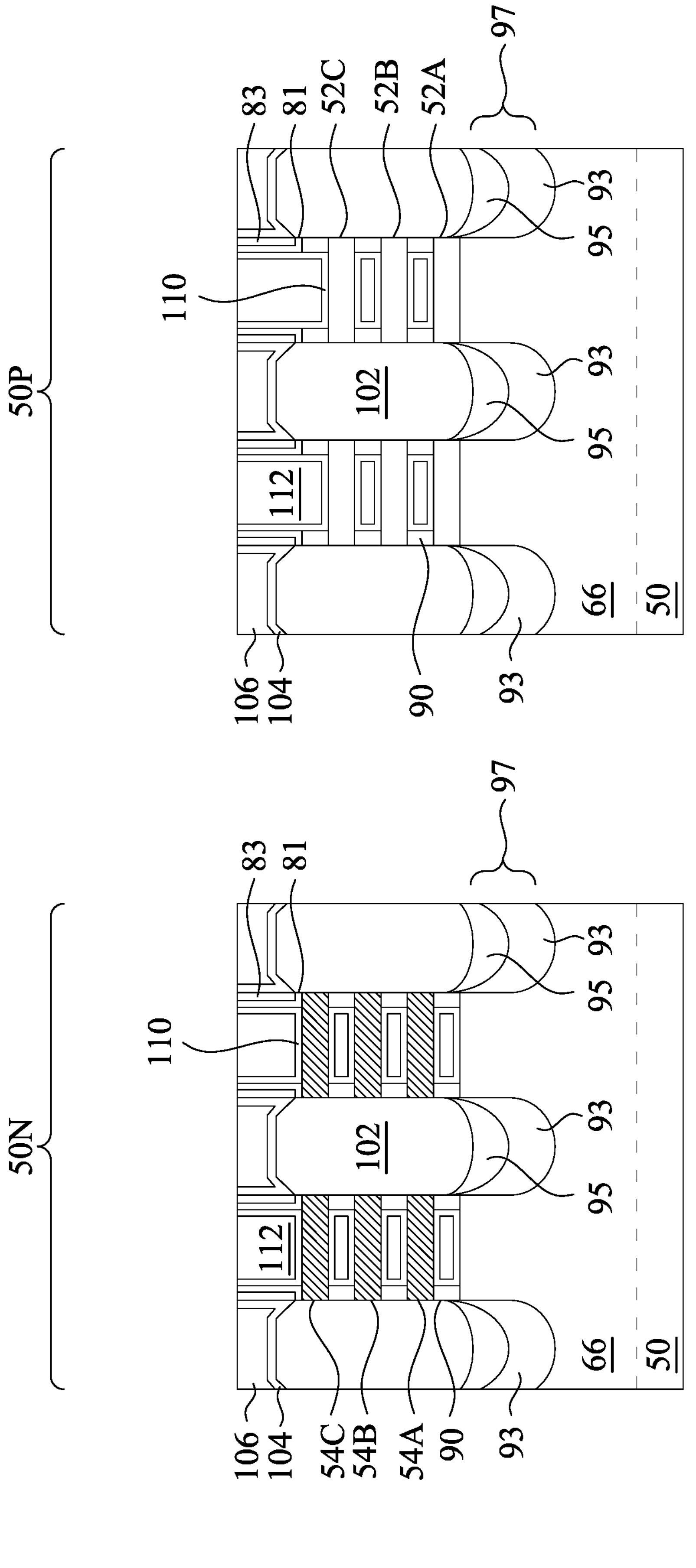

In FIGS. 21A and 21B, gate dielectric layers 110 and gate electrodes 112 are formed for replacement gates. The gate dielectric layers 110 are deposited conformally in the second recesses 105. In the n-type region 50N, the gate dielectric layers 110 may be formed on top surfaces and sidewalls of the substrate 50 and on top surfaces, sidewalls, and bottom surfaces of the second nanostructures 54, and in the p-type region 50P, the gate dielectric layers 110 may be formed on top surfaces and sidewalls of the substrate 50 and on top surfaces, sidewalls, and bottom surfaces of the first nanostructures 52. The gate dielectric layers 110 may also be deposited on top surfaces of the first ILD 106, the CESL 104, the first spacers 81, and the STI regions 68.

In accordance with some embodiments, the gate dielectric layers 110 comprise one or more dielectric layers, such as an oxide, a metal oxide, the like, or combinations thereof. For example, in some embodiments, the gate dielectrics may comprise a silicon oxide layer and a metal oxide layer over the silicon oxide layer. In some embodiments, the gate dielectric layers 110 include a high-k dielectric material, and in these embodiments, the gate dielectric layers 110 may have a k value greater than about 7.0, and may include a metal oxide or a silicate of hafnium, aluminum, zirconium, lanthanum, manganese, barium, titanium, lead, and combinations thereof. The structure of the gate dielectric layers 110 may be the same or different in the n-type region 50N and the p-type region 50P. The formation methods of the gate dielectric layers 110 may include molecular-beam deposition (MBD), ALD, PECVD, and the like.

The gate electrodes 112 are deposited over the gate dielectric layers 110, respectively, and fill the remaining portions of the second recesses 105. The gate electrodes 112 may include a metal-containing material such as titanium nitride, titanium oxide, tantalum nitride, tantalum carbide, cobalt, ruthenium, aluminum, tungsten, combinations thereof, or multi-layers thereof. For example, although single layer gate electrodes 112 are illustrated in FIGS. 21A and 21B, the gate electrodes 112 may comprise any number of liner layers, any number of work function tuning layers, and a fill material. Any combination of the layers which make up the gate electrodes 112 may be deposited in the n-type region 50N between adjacent ones of the second nanostructures 54 and between the second nanostructure 54A and the substrate 50, and may be deposited in the p-type region 50P between adjacent ones of the first nanostructures 52.

The formation of the gate dielectric layers 110 in the n-type region 50N and the p-type region 50P may occur simultaneously such that the gate dielectric layers 110 in each region are formed from the same materials, and the formation of the gate electrodes 112 may occur simultaneously such that the gate electrodes 112 in each region are formed from the same materials. In some embodiments, the gate dielectric layers 110 in each region may be formed by distinct processes, such that the gate dielectric layers 110 may be different materials and/or have a different number of layers, and/or the gate electrodes 112 in each region may be formed by distinct processes, such that the gate electrodes 112 may be different materials and/or have a different number of layers. Various masking steps may be used to mask and expose appropriate regions when using distinct processes.

After the filling of the second recesses 105, a planarization process, such as a CMP, may be performed to remove the excess portions of the gate dielectric layers 110 and the material of the gate electrodes 112, which excess portions are over the top surface of the first ILD 106. The remaining portions of material of the gate electrodes 112 and the gate dielectric layers 110 thus form replacement gate structures of the resulting nano-FETs. The gate electrodes 112 and the gate dielectric layers 110 may be collectively referred to as "gate structures."

Figure 22A:
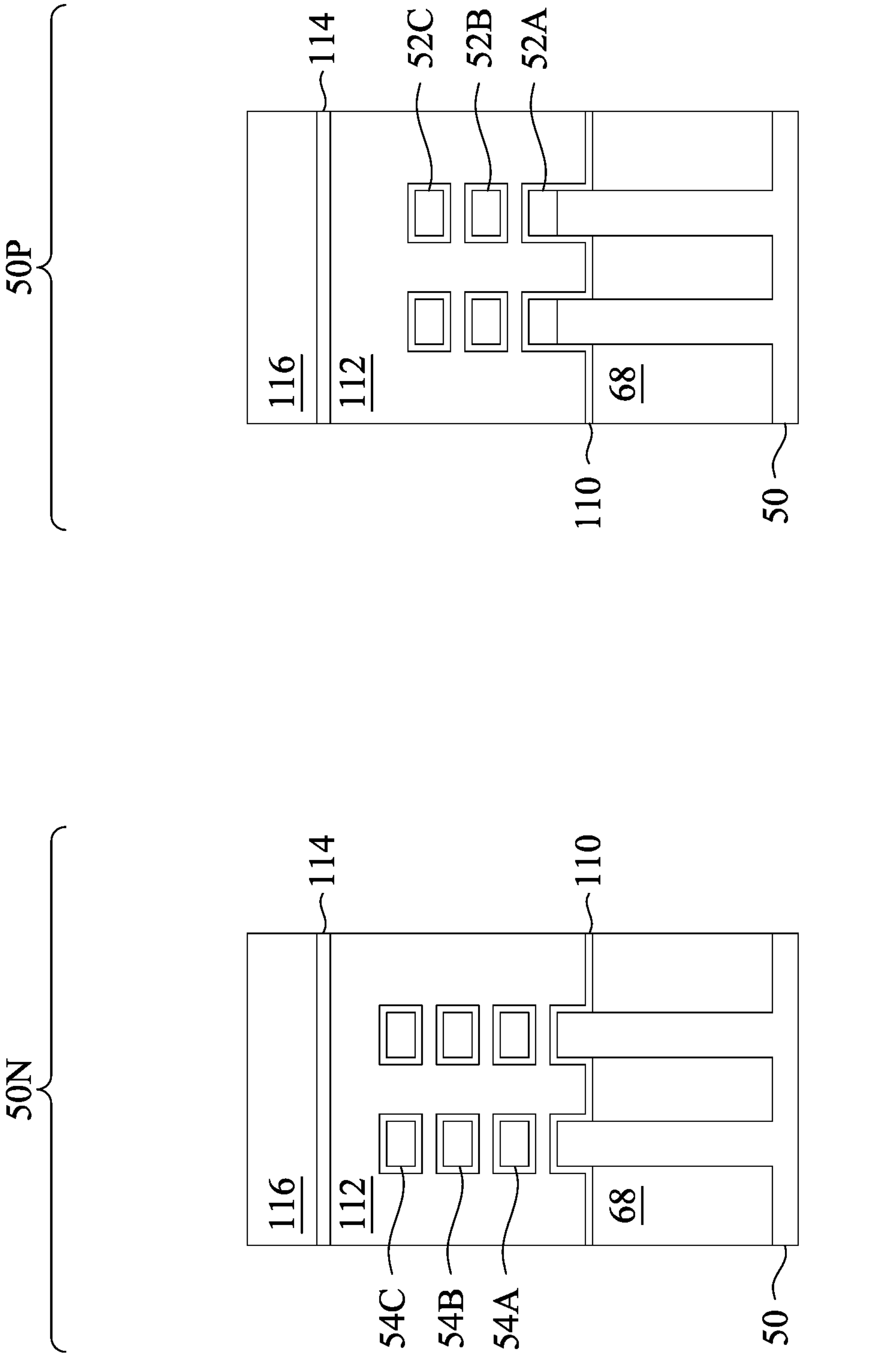
Figure 22B:
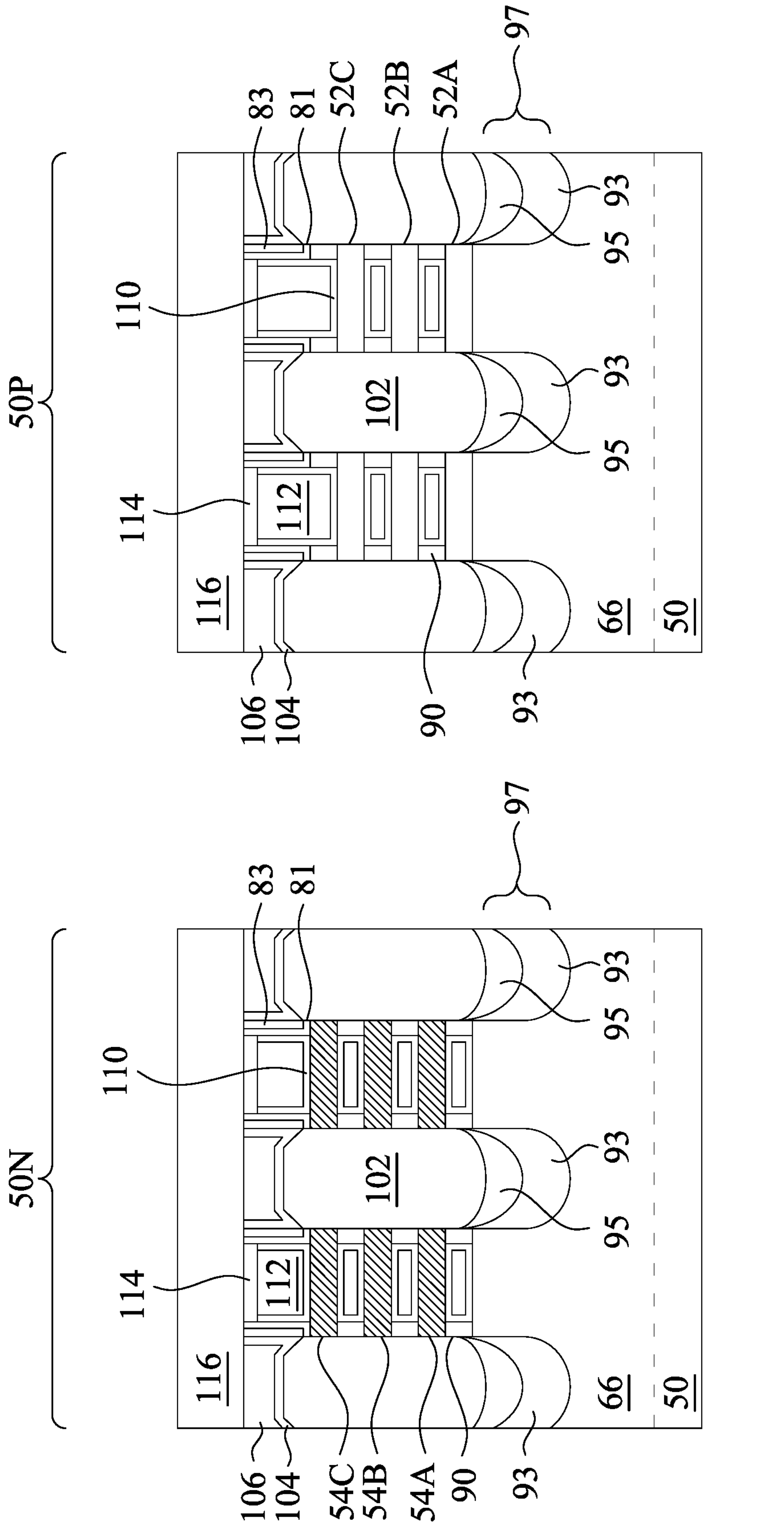
Figure 22C:
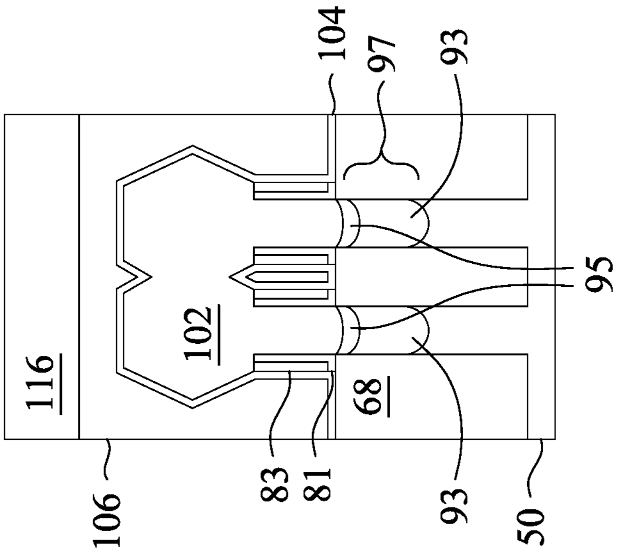

In FIGS. 22A, 22B, and 22C, the gate structure (including the gate dielectric layers 110 and the corresponding overlying gate electrodes 112) is recessed, so that a recess is formed directly over the gate structure and between opposing portions of first spacers 81. A gate mask 114 comprising one or more layers of dielectric material, such as silicon nitride, silicon oxynitride, or the like, is filled in the recess, followed by a planarization process to remove excess portions of the dielectric material extending over the first ILD 106. Subsequently formed gate contacts (such as the gate contacts 124, discussed below with respect to FIGS. 23A and 23B) penetrate through the gate mask 114 to contact the top surface of the recessed gate electrodes 112.

As further illustrated by FIGS. 22A-22C, a second ILD 116 is deposited over the first ILD 106 and over the gate mask 114. In some embodiments, the second ILD 116 is a flowable film formed by FCVD. In some embodiments, the second ILD 116 is formed of a dielectric material such as PSG, BSG, BPSG, USG, or the like, and may be deposited by any suitable method, such as CVD, PECVD, or the like.

Figure 23A:
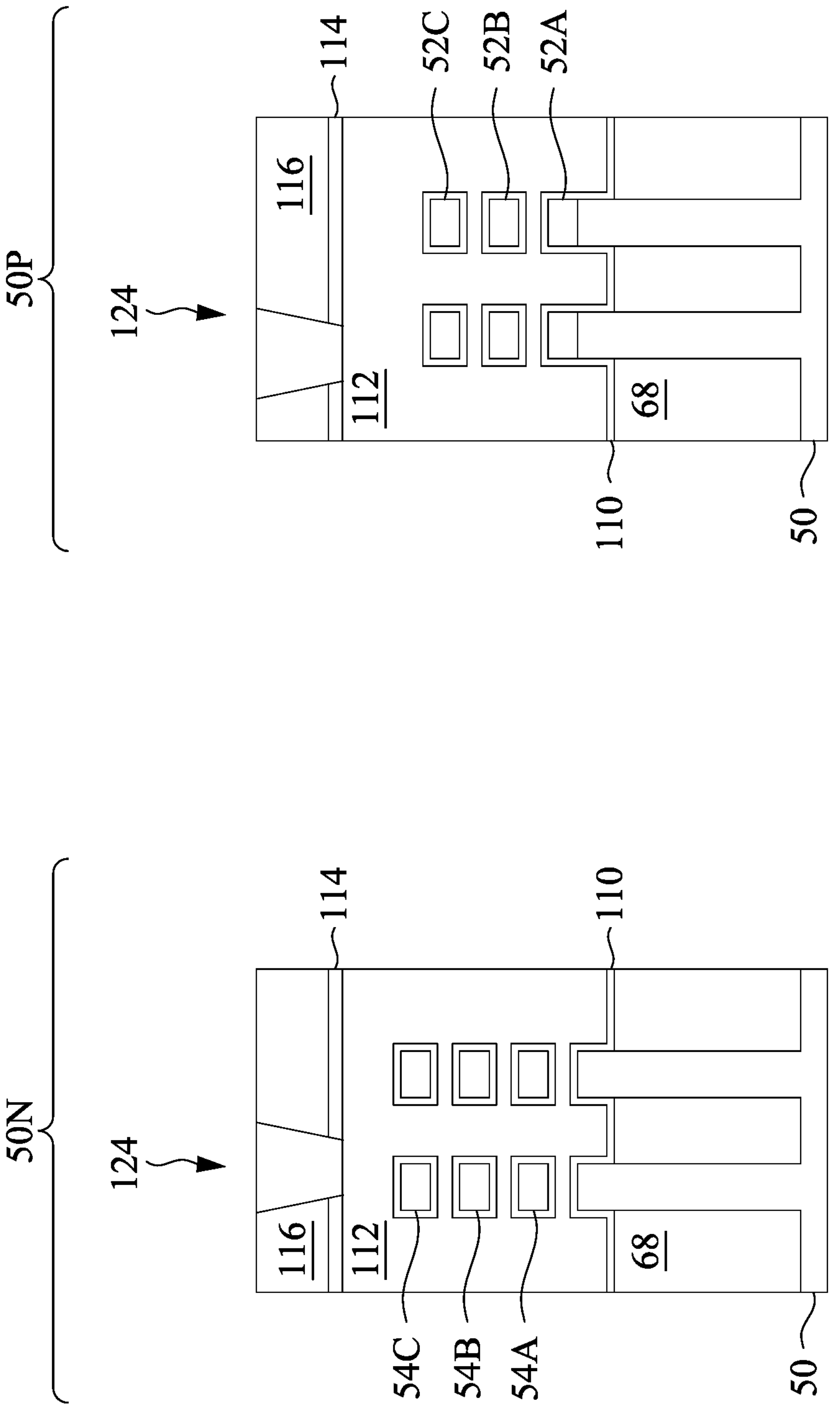
Figure 23B:
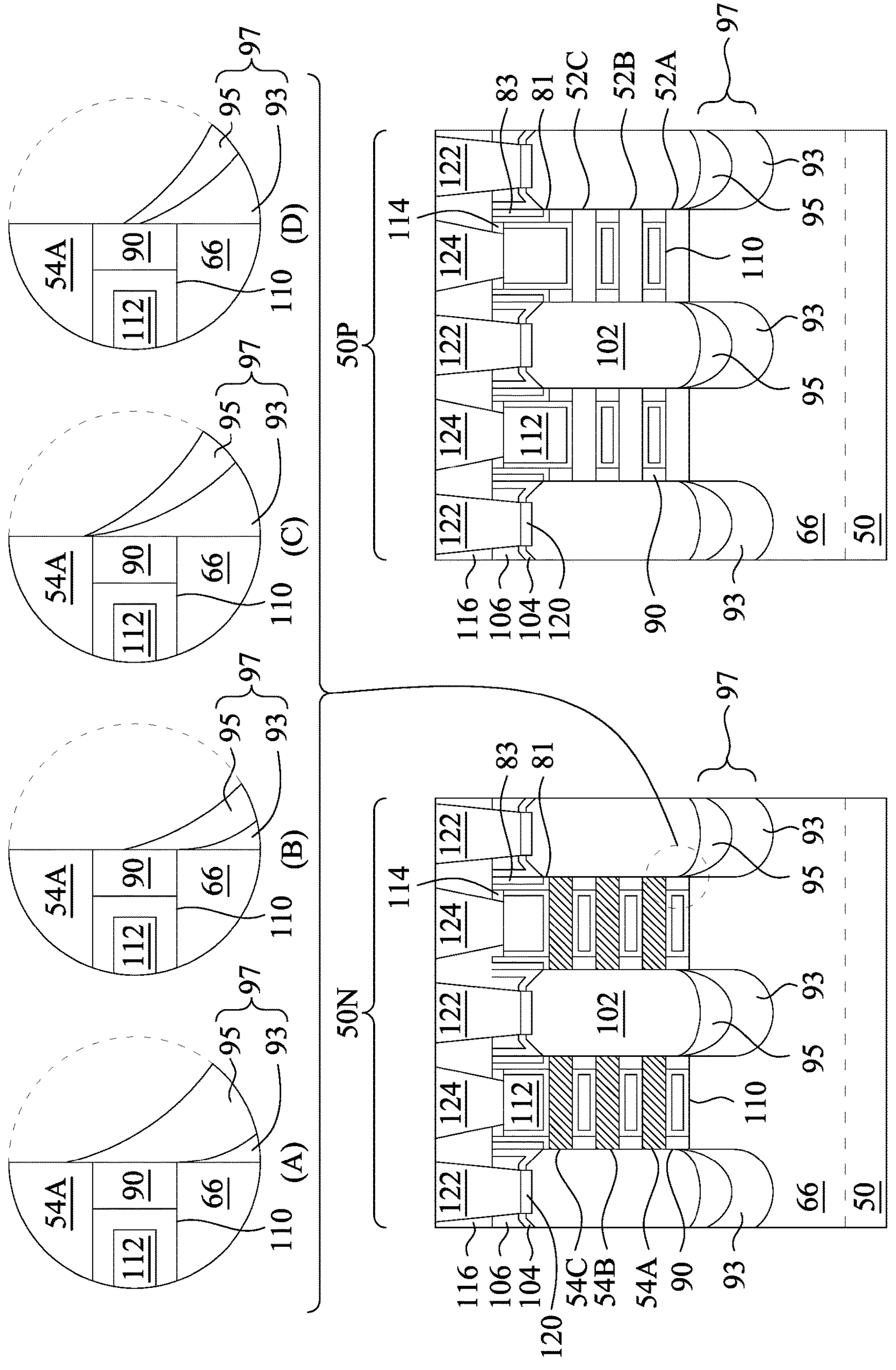
Figure 23C:
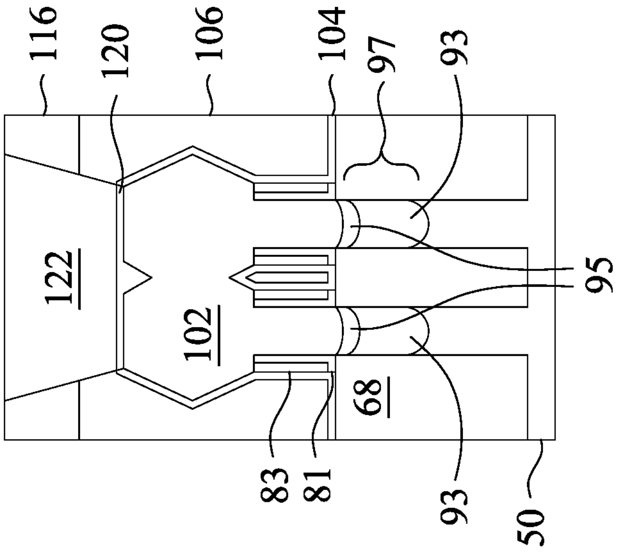

In FIGS. 23A, 23B, and 23C, the second ILD 116, the first ILD 106, the CESL 104, and the gate masks 114 are etched to form third recesses exposing surfaces of the epitaxial source/drain regions 102 and/or the gate structure. The third recesses may be formed by etching using an anisotropic etching process, such as RIE, NBE, or the like. In some embodiments, the third recesses may be etched through the second ILD 116 and the first ILD 106 using a first etching process; may be etched through the gate masks 114 using a second etching process; and may then be etched through the CESL 104 using a third etching process. A mask, such as a photoresist, may be formed and patterned over the second ILD 116 to mask portions of the second ILD 116 from the first etching process and the second etching process. In some embodiments, the etching process may over-etch, and therefore, the third recesses extend into the epitaxial source/drain regions 102 and/or the gate structure, and a bottom of the third recesses may be level with (e.g., at a same level, or having a same distance from the substrate), or lower than (e.g., closer to the substrate) the epitaxial source/drain regions 102 and/or the gate structure. Although FIG. 23B illustrate the contacts 122 and 124 formed in the third recesses in a same cross section, in various embodiments, the epitaxial source/drain regions 102 and the gate structure may be exposed by the third recesses in different cross-sections, thereby reducing the risk of shorting subsequently formed contacts. After the third recesses are formed, silicide regions 120 are formed over the epitaxial source/drain regions 102. In some embodiments, the silicide regions 120 are formed by first depositing a metal (not shown) capable of reacting with the semiconductor materials of the underlying epitaxial source/drain regions 102 (e.g., silicon, silicon germanium, germanium) to form silicide or germanide regions, such as nickel, cobalt, titanium, tantalum, platinum, tungsten, other noble metals, other refractory metals, rare earth metals or their alloys, over the exposed portions of the epitaxial source/drain regions 102, then performing a thermal anneal process to form the silicide regions 120. The un-reacted portions of the deposited metal are then removed, e.g., by an etching process. Although silicide regions 120 are referred to as silicide regions, silicide regions 120 may also be germanide regions, or silicon germanide regions (e.g., regions comprising silicide and germanide). In an embodiment, the silicide region 120 comprises TiSi, and has a thickness in a range between about 2 nm and about 10 nm.

Next, contacts 122 and 124 (may also be referred to as contact plugs) are formed in the third recesses. The contacts 122 and 124 may each comprise one or more layers, such as barrier layers, diffusion layers, and fill materials. For example, in some embodiments, the contacts 122 and 124 each include a barrier layer and a conductive material, and is electrically coupled to the underlying conductive feature (e.g., gate electrodes 112 and/or silicide region 120 in the illustrated embodiment). The contacts 124 are electrically coupled to the gate electrodes 112 and may be referred to as gate contacts, and the contacts 122 are electrically coupled to the silicide regions 120 and may be referred to as source/drain contacts. The barrier layer may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD 116.

FIG. 23B provides four call-out circles (A), (B), (C), and (D) which show variations with respect to how the trench isolation structure 97 interacts with the sidewall spacer 90 and channel regions 54A. The call-out circles variations are is provided for the n-type region 50N, however it should be understood that the call-out circle (B) and (D) apply to the p-type region 50P if one were to substitute the sidewall spacer 90 with the channel region 52A. The call-out circles (A) and (C) would not apply to the p-type region 50P in these embodiments because the channel region 52A (if substituted for the sidewall spacer 90, gate dielectric layers 110, and gate electrodes 112) would be covered by the trench isolation structure 97. It should be noted that these variations may be combined with the above descriptions in FIGS. 15C and 15D which describes the interaction of the trench isolation structure 97 with the fins 66. Further, with regard to the call-out circles (A), (B), (C), and (D) discussed below, each of these aspects of the upper isolation structure 95 and lower isolation structure 93 may be combined as appropriate.

With regard to the lower isolation structure 93, in call-out circle (A), the lower isolation structure 93 is illustrated as not contacting the inner spacer 90. The lower isolation structure 93 instead covers only part of the fins 66 and a portion of the fins 66 remains free from the lower isolation structure 93. In call-out circle (B), the lower isolation structure 93 covers all of the fins 66 and coincides with the bottom of the sidewall spacer 90. In call-out circle (C), the lower isolation structure 93 covers all of the fins 66 and also covers all of the sidewall spacer 90. In call-out circle (D), the lower isolation structure 93 covers all of the fins 66 and has an interface with the sidewall spacer 90 that stops at a position interposed between the upper surface of the sidewall spacer 90 and the lower surface of the sidewall spacer 90.

With regard to the upper isolation structure 95, in call-out circle (A), the upper isolation structure 95 is illustrated as covering all of the inner spacer 90. In addition, the upper isolation structure 95, may contact a portion of the second nanostructure 54A. The upper isolation structure 95 also may contact a portion of the fins 66. In call-out circle (B), the upper isolation structure 95 has an interface with the sidewall spacer 90 that stops at a position interposed between the upper surface of the sidewall spacer 90 and the lower surface of the sidewall spacer 90. In call-out circle (C), the upper isolation structure 95 has an interface that coincides with the interface between the second nanostructure 54A. In call-out circle (D), the upper isolation structure 95 has an interface with the sidewall spacer 90 that starts at a position interposed between the upper surface of the sidewall spacer 90 and the lower surface of the sidewall spacer 90 and stops at a position interposed between the upper surface of the sidewall spacer 90 and the lower surface of the sidewall spacer 90, where the start position is lower than the stop position.

FIGS. 24A, 24B, and 24C illustrate cross-sectional views of a device according to some alternative embodiments. FIGS. 24A illustrates reference cross-section A-A' illustrated in FIG. 1. FIG. 24B illustrates reference cross-section B-B' illustrated in FIG. 1. FIG. 24C illustrates reference cross-section C-C' illustrated in FIG. 1. In FIGS. 24A-24C, like reference numerals indicate like elements formed by like processes as the structure of FIGS. 23A-23C. However, in FIGS. 24A-24C, channel regions in the n-type region 50N and the p-type region 50P comprise a same material. For example, the second nanostructures 54, which comprise silicon, provide channel regions for p-type nano-FETs in the p-type region 50P and for n-type nano-FETs in the n-type region 50N. The structure of FIGS. 24A-24C may be formed, for example, by removing the first nanostructures 52 from both the p-type region 50P and the n-type region 50N simultaneously; depositing the gate dielectric layers 110 and the gate electrodes 112P (e.g., gate electrode suitable for a p-type nano-FET) around the second nanostructures 54 in the p-type region 50P; and depositing the gate dielectric layers 110 and the gate electrodes 112N (e.g., a gate electrode suitable for a n-type nano-FET) around the second nanostructures 54 in the n-type region 50N. In such embodiments, materials of the epitaxial source/drain regions 102 may be different in the n-type region 50N compared to the p-type region 50P as explained above.

FIG. 24B illustrates the same the call-out circles (A), (B), (C), and (D) discussed above with respect to FIG. 23B. Because the embodiment illustrated in FIGS. 24A-24C utilizes the second nanostructures 54 as the channel regions for both the n-type nano-FETs and the p-type nano-FETs, the description above with respect to each of the call-out circles (A), (B), (C), and (D) applies to both the n-type region 50N and the p-type region 50P illustrated in FIGS. 24A-C.

Embodiments may achieve advantages. For example, embodiments provide a trench isolation structure (e.g., trench isolation structure 97 (including the lower isolation structure 93 and upper isolation structure 95)) under the epitaxial regions 102, which reduces parasitic capacitance as well as provides a reduction in current leakage through the fins 66 and/or substrate 50. The lower isolation structure 93 provides a low-k insulating material, which provides better isolation, for example over a higher k insulating material, for reducing parasitic capacitance and current leakage, but also may be more susceptible to damage. The upper isolation structure 95 is a denser material composition with increased etch resistance over the lower isolation structure 93, which is utilized to protect the lower isolation structure 93 from damage resulting from subsequent cleaning processes and/or the growth of epitaxial regions in the remaining first recesses 86. Thus, utilizing the combination of the upper isolation structure 95 and lower isolation feature 93 for the trench isolation structure 97 provides good isolation and structural robustness from the epitaxial source/drain regions.

One embodiment is a method including forming a multi-layer stack of alternating first semiconductor material layers and second semiconductor material layers over a semiconductor substrate. The method also includes patterning the multi-layer stack into a first fin, the first fin having a first lengthwise direction. The method also includes forming a dummy gate structure over the first fin, the dummy gate structure having a second lengthwise direction. The method also includes etching a first recess in the first fin adjacent the dummy gate structure, the first recess extending into the semiconductor substrate. The method also includes depositing a first insulating film in the first recess, the first insulating film having a first k value. The method also includes depositing a second insulating film in the first recess over the first insulating film, the second insulating film having a second k value, the second k value being greater than the first k value. The method also includes forming an epitaxial region in the first recess over the second insulating film. In an embodiment, the method includes after depositing the first insulating film, etching the first insulating film to remove a portion of the first insulating film along sidewalls of the dummy gate structure; after depositing the second insulating film, etching the second insulating film to remove a portion of the second insulating film along sidewalls of the dummy gate structure. In an embodiment, after etching the second insulating film, a portion of the first insulating film or the second insulating film remains over the dummy gate structure. In an embodiment, forming the epitaxial region may include forming a first epitaxial layer on the sidewall spacer, a surface of the first epitaxial layer having a curved surface opposite a sidewall of the sidewall spacer, and forming a second epitaxial layer over the first epitaxial layer. In an embodiment, after forming the epitaxial region, the second insulating film has an interface with the sidewall spacer. In an embodiment, the first fin may include a fin portion of the multi-layer stack over a fin portion of the semiconductor substrate, where the first recess exposes the fin portion of the semiconductor substrate, where after forming the epitaxial region, the first insulating film completely covers the fin portion of the semiconductor substrate. In an embodiment, depositing the first insulating film is done at a processing temperature which is lower than a processing temperature used to deposit the second insulating film. In an embodiment, the second insulating film is denser than the first insulating film.

Another embodiment is a method including forming first nanostructures and second nanostructures over a substrate, each of the first nanostructures alternating with each of the second nanostructures, the substrate, the first nanostructures, and second nanostructures stacked to form a first fin. The method also includes forming a dummy gate structure over the first fin. The method also includes forming a recess in the first fin adjacent the dummy gate structure, the recess continuing through the first nano structures, the second nanostructures, and exposing the substrate. The method also includes depositing a first insulating layer in the recess and over the dummy gate structure. The method also includes etching the first insulating layer to form a first isolation structure at a bottom of the recess. The method also includes depositing a second insulating layer in the recess over the first isolation structure and over the dummy gate structure. The method also includes etching the second insulating layer to form a second isolation structure over the first isolation structure, where a etch resistance of the second insulating layer is greater than an etch resistance of the first insulating layer. In an embodiment, the second insulation layer is deposited with a lesser oxygen content than the first insulation layer. In an embodiment, a portion of the substrate in the recess is free from the first isolation structure, where the second isolation structure contacts the substrate in the recess, where after forming the second isolation structure a portion of the second isolation structure contacts the sidewall spacers. In an embodiment, the method includes depositing a first portion of a first layer of an epitaxial region on the sidewall spacers and a second portion of the first layer of the epitaxial region on the second isolation structure, where the first portion has a curved surface opposite a sidewall of the sidewall spacers, the second portion has a curved surface opposite an interface with the second isolation structure, and where the first portion is merged with the second portion; and the method includes depositing a second layer of the epitaxial region over the first layer of the epitaxial region, the second layer filling the recess.

Another embodiment is a device including a first nanostructure, and a second nanostructure over the first nanostructure. The device also includes a first spacer interposed between an end of the second nanostructure and a corresponding end of the first nanostructure. The device also includes a second spacer interposed between the corresponding end of the first nanostructure and a substrate. The device also includes an epitaxial region adjacent the first nanostructure and the second nanostructure, the epitaxial region contacting the first spacer, the end of the second nanostructure, and the corresponding end of the first nanostructure. The device also includes a trench isolation structure under the epitaxial region, the trench isolation structure including a first isolation structure under a second isolation structure, the first isolation structure in contact with the substrate, the first isolation structure having a lower k value than the second isolation structure. In an embodiment, an oxygen content of the first isolation structure is greater than an oxygen content of the second isolation structure. In an embodiment, the first isolation structure and the second isolation structure may include the same materials at different material atomic percentages. In an embodiment, the epitaxial region may include a first layer contacting the second isolation structure, the first spacer, and the second spacer, the first layer having a curvilinear surface opposite respective interfaces with the second isolation structure, the first spacer, and the second spacer. In an embodiment, a ratio of a thickness of the second isolation structure to the first isolation structure is between 0.5:1 to 1:1. In an embodiment, a portion of the substrate is free from the first isolation structure, where the second isolation structure contacts the substrate adjacent the first isolation structure. In an embodiment, the second isolation structure contacts a sidewall of the second spacer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:

forming a multi-layer stack of alternating first semiconductor material layers and second semiconductor material layers over a semiconductor substrate;

patterning the multi-layer stack into a first fin, the first fin having a first lengthwise direction;

forming a dummy gate structure over the first fin, the dummy gate structure having a second lengthwise direction;

etching a first recess in the first fin adjacent the dummy gate structure, the first recess extending into the semiconductor substrate;

depositing a first insulating film in the first recess, the first insulating film having a first k value;

after depositing the first insulating film, depositing a second insulating film in the first recess over the first insulating film, the second insulating film having a second k value, the second k value being greater than the first k value, the second insulating film completely covering the first insulating film and contacting the semiconductor substrate; and forming an epitaxial region in the first recess over the second insulating film.

2. The method of claim 1, further comprising:

after depositing the first insulating film, etching the first insulating film to remove a portion of the first insulating film along sidewalls of the dummy gate structure; and after depositing the second insulating film, etching the second insulating film to remove a portion of the second insulating film along sidewalls of the dummy gate structure.

3. The method of claim 2, wherein after etching the second insulating film, a portion of the first insulating film or the second insulating film remains over the dummy gate structure.

4. The method of claim 1, further comprising:

forming a sidewall spacer in the first recess along a sidewall of a first layer of the first fin, wherein forming the epitaxial region comprises forming a first epitaxial layer on the sidewall spacer, a surface of the first epitaxial layer having a curved surface opposite a sidewall of the sidewall spacer, and forming a second epitaxial layer over the first epitaxial layer.

5. The method of claim 4, wherein after forming the epitaxial region, the second insulating film has an interface with the sidewall spacer.

6. The method of claim 1, wherein the first fin comprises a fin portion of the multi-layer stack over a fin portion of the semiconductor substrate, wherein the first recess exposes the fin portion of the semiconductor substrate, wherein after forming the epitaxial region, the first insulating film completely covers the fin portion of the semiconductor substrate.

7. The method of claim 1, wherein depositing the first insulating film is done at a processing temperature which is lower than a processing temperature used to deposit the second insulating film.

8. The method of claim 1, wherein the second insulating film is denser than the first insulating film.

9. A method comprising:

forming first nanostructures and second nanostructures over a substrate, each of the first nanostructures alternating with each of the second nanostructures, wherein the substrate, the first nanostructures, and the second nanostructures are stacked to form a first fin;

forming a dummy gate structure over the first fin;

forming a recess in the first fin adjacent the dummy gate structure, the recess continuing through the first nanostructures, the second nanostructures, and exposing the substrate;

depositing a first insulating layer in the recess and over the dummy gate structure;

after depositing the first insulating layer, etching the first insulating layer to form a first isolation structure at a bottom of the recess;

after etching the first insulating layer, depositing a second insulating layer in the recess over the first isolation structure and over the dummy gate structure; and etching the second insulating layer to form a second isolation structure over the first isolation structure, wherein an etch resistance of the second insulating layer is different from an etch resistance of the first insulating layer, wherein the second isolation structure contacts the substrate, wherein a top surface of a center portion of the second isolation structure is lower than a top surface of the substrate.

10. The method of claim 9, wherein the second insulating layer is deposited with a lesser oxygen content than the first insulating layer.

11. The method of claim 9, further comprising:

forming sidewall spacers on sidewalls of a base nanostructure of the first nanostructures, wherein after forming the second isolation structure a portion of the second isolation structure contacts the sidewall spacers.

12. The method of claim 11, further comprising:

depositing a first portion of a first layer of an epitaxial region on the sidewall spacers and a second portion of the first layer of the epitaxial region on the second isolation structure, the first portion having a curved surface opposite a sidewall of the sidewall spacers, the second portion having a curved surface opposite an interface with the second isolation structure, wherein the first portion is merged with the second portion; and depositing a second layer of the epitaxial region over the first layer of the epitaxial region, the second layer filling the recess.

13. A method comprising:

forming a first fin protruding from a substrate, the first fin having a first lengthwise direction;

forming a dummy gate structure over the first fin, the dummy gate structure having a second lengthwise direction;

etching a first recess in the first fin adjacent the dummy gate structure, the first recess extending into the substrate;

depositing a first insulating film in the first recess, the first insulating film being a first dielectric material, wherein after depositing the first insulating film a portion of the substrate is exposed in the first recess;

after depositing the first insulating film, depositing a second insulating film in the first recess over the first insulating film, the second insulating film being a second dielectric material different than the first dielectric material, wherein the second dielectric material covers the first insulating film, wherein the second dielectric material contacts the substrate; and forming an epitaxial region in the first recess over the second insulating film, wherein the second insulating film separates the epitaxial region from the first insulating film.

14. The method of claim 13, wherein the second dielectric material has a k value greater than the first dielectric material.

15. The method of claim 13, wherein an oxygen content of the first insulating film is greater than an oxygen content of the second insulating film.

16. The method of claim 13, wherein a ratio of a first thickness of the first insulating film to a second thickness of the second insulating film is between 2:1 and 1:1.

17. The method of claim 13, wherein the first fin includes alternating layers of a first material and a second material over the substrate, wherein the first insulating film is recessed below an upper surface of the substrate.

18. The method of claim 17, wherein an upper surface of the second insulating film is above the upper surface of the substrate.

19. The method of claim 17, further comprising:

after etching the first recess and prior to depositing the first insulating film, recessing a sidewall of a first layer of the first material to form a second recess; and forming an inner spacer in the second recess.

20. The method of claim 1, further comprising:

prior to depositing the first insulating film, recessing a sidewall of a first layer of the multi-layer stack; and forming an inner spacer along the sidewall of the first layer of the multi-layer stack.

* * * * *